United States Patent
Onose

(10) Patent No.: US 8,227,831 B2
(45) Date of Patent: Jul. 24, 2012

(54) SEMICONDUCTOR DEVICE HAVING A JUNCTION FET AND A MISFET FOR CONTROL

(75) Inventor: Hidekatsu Onose, Hitachi (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 329 days.

(21) Appl. No.: 12/715,466

(22) Filed: Mar. 2, 2010

(65) Prior Publication Data

US 2010/0224885 A1    Sep. 9, 2010

(30) Foreign Application Priority Data

Mar. 5, 2009    (JP) .................................... 2009-52476

(51) Int. Cl.
*H01L 29/66*    (2006.01)

(52) U.S. Cl. .......... 257/133; 257/77; 257/107; 257/134; 257/136

(58) Field of Classification Search .................... 257/77, 257/107, 133, 134, 136
See application file for complete search history.

(56) References Cited

U.S. PATENT DOCUMENTS

| | | | | |
|---|---|---|---|---|
| 6,054,752 A * | 4/2000 | Hara et al. | ..................... | 257/629 |
| 7,470,952 B2 * | 12/2008 | Ruething et al. | .............. | 257/327 |
| 7,579,642 B1 * | 8/2009 | Bulucea | ........................ | 257/303 |
| 7,772,613 B2 * | 8/2010 | Shimizu et al. | ............... | 257/135 |
| 2009/0014719 A1 * | 1/2009 | Shimizu et al. | ................. | 257/49 |
| 2010/0224885 A1 * | 9/2010 | Onose | ............................. | 257/77 |

FOREIGN PATENT DOCUMENTS

JP    2009-021461 A    1/2009

* cited by examiner

*Primary Examiner* — Thao Le
*Assistant Examiner* — Eric Jones
(74) *Attorney, Agent, or Firm* — Miles & Stockbridge P.C.

(57) ABSTRACT

A semiconductor device having a junction FET having improved characteristics is provided. The semiconductor device has a junction FET as a main transistor and has a MISFET as a transistor for control. The junction FET has a first gate electrode, a first source electrode, and a first drain electrode. The MISFET has a second gate electrode, a second source electrode, and a second drain electrode. The MISFET is an n-channel type MISFET and has electric characteristics of an enhancement mode MISFET. The second gate electrode and the second drain electrode of the MISFET are connected to each other by short-circuiting. The first gate electrode of the junction FET and the second source electrode of the MISFET are connected to each other by short-circuiting.

13 Claims, 12 Drawing Sheets

SEMICONDUCTOR DEVICE HAVING A JUNCTION FET AND A MISFET FOR CONTROL

CROSS-REFERENCE TO RELATED APPLICATION

The present application claims priority from Japanese Patent Application No. JP 2009-052476 filed on Mar. 5, 2009, the content of which is hereby incorporated by reference into this application.

TECHNICAL FIELD OF THE INVENTION

The present invention relates to a semiconductor device technique and particularly relates to a technique effectively applied to a semiconductor device having a junction field effect transistor (JFET).

BACKGROUND OF THE INVENTION

The dielectric breakdown field of silicon carbide (SiC) is about 10 times higher than that of silicon (Si). Therefore, silicon carbide is a material which enables a drift layer, which maintains a breakdown voltage, to be thin and have a high concentration. Therefore, SiC power devices are expected to realize loss reduction compared to Si devices in the higher voltage application. One of them is a junction field effect transistor (hereinafter, simply called "junction FET"). The junction FET is a device which turns on/off a current by controlling the expansion of a depletion layer between a p-type region of a gate and an n-region of a channel for current flow by a gate voltage.

In the case of a normally-off type junction FET, when a gate voltage is not applied (0 V), no current flows, and a blocking state is obtained; when a positive gate voltage is applied, an on-state in which a current flows is obtained. In such a normally-off type junction FET, since the gate voltage at which the on-state is obtained (hereinafter, threshold voltage) has to be set to be smaller than or equal to the diffusion potential of the pn-junction, the threshold voltage is about 2.5 V at most. Since the threshold voltage is the gate voltage at which the channel begins opening, almost no current flows at the point of the threshold voltage. Therefore, usually, the threshold voltage is designed to be about 1 to 1.5 V.

For example, Japanese Patent Application Laid-Open No. 2009-021461 (Patent Document 1) discloses a semiconductor device technique in which diodes are connected to a gate terminal of a junction FET. As a result, built-in voltages of the connected diodes can be added to the threshold voltage of the single junction FET, thereby practically increasing the threshold voltage.

SUMMARY OF THE INVENTION

In a junction FET studied by the present inventor, it is difficult to increase the threshold voltage due to the restriction that the threshold voltage has to be smaller than or equal to the diffusion potential of the gate pn-junction. When the threshold voltage is low in this manner, if noise comes into the gate in an off-state, sometimes the element may be erroneously turned on due to the gate voltage that exceeds the threshold voltage. Since the noise increases in proportion to a current, this becomes a more notable problem in the elements in which the amounts of treated currents are large. Particularly, in an inverter device, in which two switching elements are connected in series and operated such that only either one of the individual elements is turned on, the two switches connected in series may be turned on at the same time due to a malfunction, and the element may be destroyed when a short-circuit current flows.

Therefore, the inventor of the present invention has studied a semiconductor device in which a diode is connected to a gate terminal of a junction FET like that described above. As the connected diode for improving the threshold voltage, a pn diode of Si or a pn diode of SiC is conceivable. The pn diode of Si has a built-in voltage of about 0.6 V, and the pn diode of SiC has a built-in voltage of about 2.5 V. Thus, when the threshold voltage of the single junction FET is about 1 V, the threshold voltage of the junction FET viewed from a gate drive circuit is about 1.6 V and about 3.5 V, respectively.

In further studies carried out by the present inventor, in order to suppress the malfunction of the junction FET, a threshold voltage of about 5 V or larger is desired; and, in order to adjust the threshold voltage by the diode connection, seven or more pn diodes of Si or two or more pn diodes of SiC have to be connected in series. Therefore, in the technical trend of increasing the degree of integration is desired by further miniaturizing semiconductor elements, the present inventor has found it difficult to further improve the threshold voltage of the junction FET in his study.

Moreover, since the part between a gate and a source of a junction FET is a pn diode, when the gate voltage exceeds the built-in voltage of the pn-junction, a large gate current flows. For example, when a current capacity is 100 A, applying 3 V to the gate results in a gate current of 1 to 2 A. Then, when the gate voltage is further increased, the gate current is further rapidly increased. Similar phenomenon occurs when diodes for threshold adjustment are connected. Therefore, an overcurrent countermeasure on the assumption of the gate voltage being higher than a predetermined value is necessary, and the inventor has found out in a further study that this is load on a gate drive circuit.

As described above, in order to prevent false turn-on (erroneously-caused on-state) due to noise, a semiconductor device technique that improves the threshold voltage of the junction FET, which is viewed from the gate drive circuit, is desired. In addition, a configuration or a structure of the junction FET capable of suppressing rapid increase of the gate current even when the gate voltage is higher than a predetermined voltage is desired. Therefore, it is a preferred aim of the present invention to provide a technique that improves characteristics of a semiconductor device provided with a junction FET.

The above and other preferred aims and novel characteristics of the present invention will be apparent from the description of the present specification and the accompanying drawings.

While a plurality of inventions are disclosed in the present application, an aspect of these inventions will be briefly described as follows.

A semiconductor device having a junction FET as a main transistor and a MISFET as a transistor for control, wherein the junction FET includes a first gate electrode, a first source electrode, and a first drain electrode; the MISFET includes a second gate electrode, a second source electrode, and a second drain electrode; and the MISFET is an n-channel type and has electric characteristics of an enhancement mode MISFET. The second gate electrode and the second drain electrode of the MISFET are connected to each other by short-circuiting. The first gate electrode of the junction FET and the second source electrode of the MISFET are connected to each other by short-circuiting.

The effects obtained by the above aspect from the plurality of inventions disclosed in the present application will be briefly described below.

More specifically, characteristics of a semiconductor device having a junction FET can be improved.

BRIEF DESCRIPTIONS OF THE DRAWINGS

DESCRIPTIONS OF THE PREFERRED EMBODIMENTS

Hereinafter, embodiments of the present invention will be described in detail with reference to the accompanying drawings. Note that components having the same function are denoted by the same reference symbols throughout the drawings for describing the embodiment, and the repetitive description thereof will be omitted as much as possible.

(First Embodiment)

Figure 1:
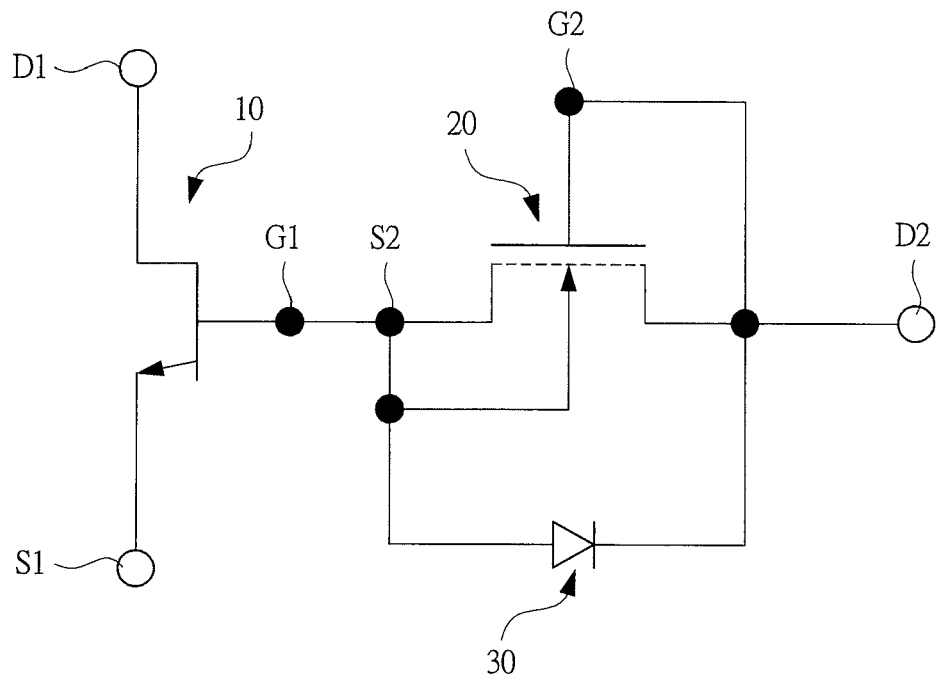
FIG. 1 is a circuit diagram of a semiconductor device which is a first embodiment of the present invention.

FIG. 1 illustrates a circuit diagram for describing a semiconductor device of a first embodiment. The semiconductor device of the first embodiment has a junction FET 10 as a main transistor. The junction FET 10 includes: a first gate electrode G1, which is a gate electrode; a first source electrode S1, which is a source electrode; and a first drain electrode D1, which is a drain electrode. The junction FET 10 of the first embodiment is an n-channel type, in which a drift layer serving as a channel is formed of an n-type semiconductor, a gate layer for generating a depletion layer in the drift layer is formed of a p-type semiconductor, and source/drain layers are formed of an n-type semiconductor. The junction FET 10 of the first embodiment is formed with using SiC as a base material.

Moreover, the semiconductor device of the first embodiment has a MISFET 20, which is a metal insulator semiconductor (MIS) type field effect transistor, as a transistor for control. The MISFET 20 includes: a second gate electrode G2, which is a gate electrode; a second source electrode S2, which is a source electrode; and a second drain electrode D2, which is a drain electrode. The MISFET 20 has electric characteristics of an enhancement (normally-off) type MISFET. The MISFET 20 of the first embodiment is the n-channel type, in which a well layer, in which a channel is formed, is formed of a p-type semiconductor, and source/drain layers are formed of an n-type semiconductor. The MISFET 20 of the first embodiment is formed with using SiC as a base material.

Moreover, the semiconductor device of the first embodiment has a diode 30. The diode 30 is connected to be parallel to the part between the source and the drain of the MISFET 20. The diode 30 of the first embodiment is formed with using SiC as a base material.

In the semiconductor device of the first embodiment, the first gate electrode G1 of the junction FET 10 is connected to the second source electrode S2 of the MISFET 20 by short-circuiting. Furthermore, the second gate electrode G2 of the MISFET 20 and the second drain electrode D2 are connected to each other by short-circuiting.

The effects of having the configuration as described above in the semiconductor device of the first embodiment will be described hereinafter with reference to electric characteristics. Among the reference symbols used in the following descriptions, those denoting the components of the semiconductor device of the first embodiment correspond to those in above-described FIG. 1.

Figure 2:
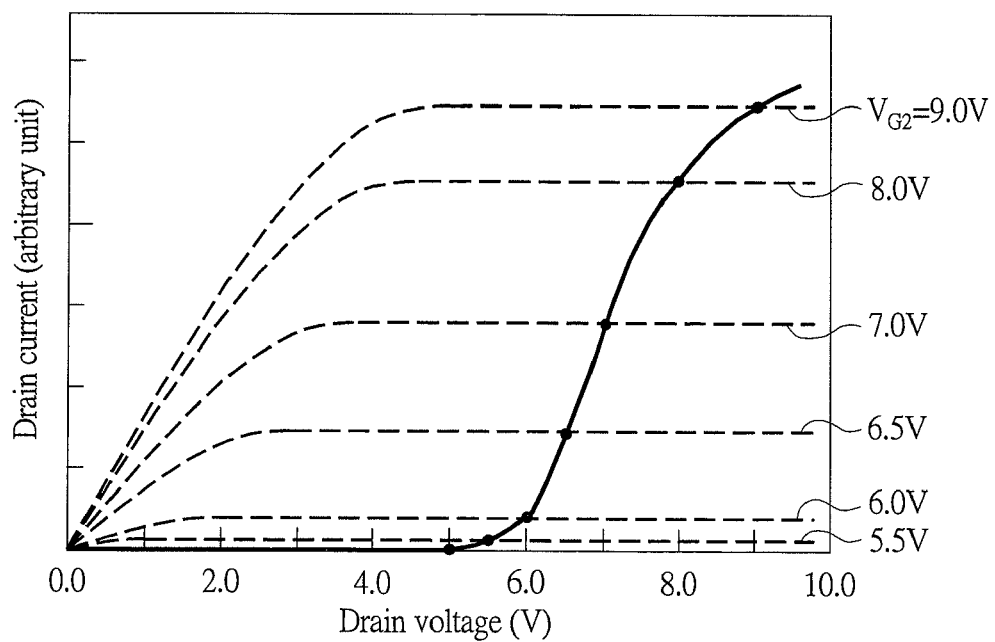
FIG. 2 is a graph illustrating characteristics of the semiconductor device which is the first embodiment of the present invention.

FIG. 2 is a graph illustrating a relation between a drain current and a drain voltage of the single MISFET 20 of the first embodiment. Broken lines represent a voltage dependence of the drain current when taking a gate voltage as a parameter. Since the MISFET is the enhancement mode, the drain current does not flow when the gate voltage is 0 V. Herein, an off-state is kept until the gate voltage becomes 5 V. When the gate voltage is increased, the MISFET 20 obtains an on-state, and the drain current flows. Due to the pinch-off effect in the on-state, increase in the drain current with respect to the increase in the gate voltage is saturated.

A solid line in FIG. 2 connects the points in the drain current at which the drain voltage and the gate voltage are equal to each other. This indicates a current-voltage characteristic of the case in which the second gate electrode G2 and the second drain electrode D2 of the MISFET 20 are short-circuited in the above-described manner.

This characteristic has a rectification property, in which a current begins flowing from a predetermined voltage value, and can be considered to be a characteristic similar to that of a diode. More specifically, the MISFET 20 is caused to have the configuration in which the second gate electrode G2 and the second drain electrode D2 are short-circuited, and, as a result, the characteristic like a diode, in which the drain side serves as an anode and the source side serves as a cathode, is exhibited. The illustrated characteristic is equivalent to a forward current-voltage characteristic of a diode having a rising voltage of about 5 V. This corresponds to the case in which the two pn diodes using SiC are connected in series. A point different from normal diodes is that this case has a current saturation property caused by a saturation property of the MISFET 20. This current saturation property is an important element for the semiconductor device of the first embodiment to solve the above-described problems. This point will be explained later in detail.

Figure 3:
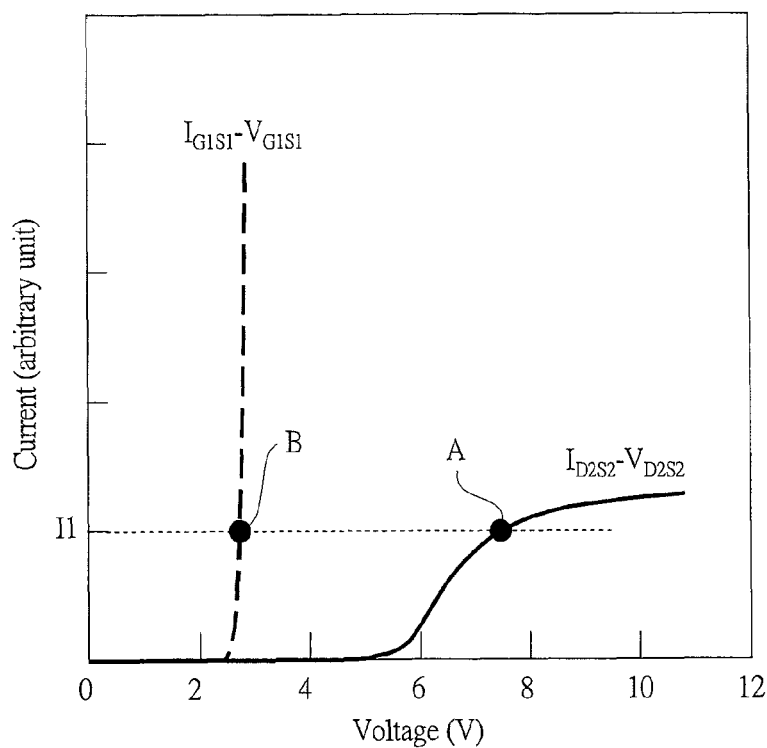
FIG. 3 is a graph illustrating other characteristics of the semiconductor device which is the first embodiment of the present invention.

The semiconductor device of the first embodiment uses the MISFET 20 having such a pseudo diode characteristic and has the configuration in which the first gate electrode G1 of the junction FET 10 and the second source electrode S2 of the MISFET 20 are connected to each other. When the potential difference between the first gate electrode G1 and the first source electrode S1 of the junction FET 10 is assumed to be a first gate-source voltage $V_{G1S1}$ and the current which flows therebetween is assumed to be a first gate-source current $I_{G1S1}$, the current-voltage characteristic illustrated by the broken line of FIG. 3 is obtained. This is for the reason that the part between the gate and the source of the junction FET 10 serves as a pn diode. On the other hand, when the potential difference between the second drain electrode D2 and the second source electrode S2 of the MISFET 20 is assumed to be a second drain-source voltage $V_{D2S2}$, and the current which flows therebetween is assumed to be a second drain-source current $I_{D2S2}$. In this case, since the MISFET 20 has the pseudo diode characteristic, a current-voltage characteristic illustrated by the solid line of FIG. 3 and having a saturation property is obtained.

Figure 4:
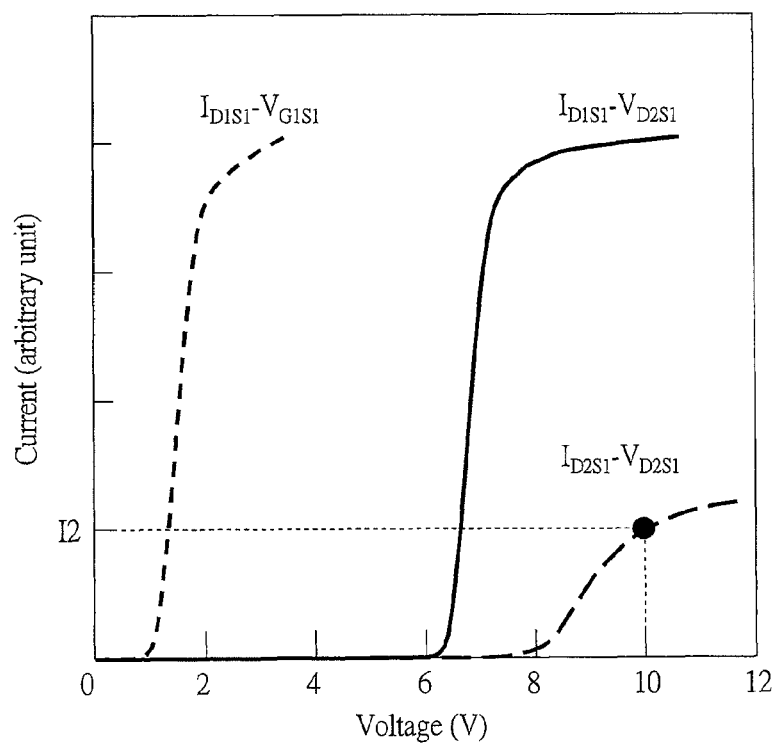
FIG. 4 is a graph illustrating still other characteristics of the semiconductor device which is the first embodiment of the present invention.

FIG. 4 is a graph illustrating current-voltage characteristics of the junction FET 10 of the first embodiment. The characteristic of the dotted line on the left side in the graph is a characteristic of a first drain-source current $I_{D1S1}$, which flows between the first drain electrode D1 and the first source electrode S1 of the junction FET 10 when the first gate-source voltage $V_{G1S1}$ of the junction FET 10 is varied (hanged). In other words, the characteristic is a gate-source voltage dependence of the drain current of the single junction FET 10 (in the state in which the MISFET 20 is not connected). A threshold voltage is 1 V. The first drain-source current $I_{D1S1}$ rises from the point at which the first gate-source voltage $V_{G1S1}$ is 1 V, and the current increases as the voltage increases. When the first gate-source voltage $V_{G1S1}$ exceeds 2.5 V, the pn diode between the first gate electrode G1 and the first source electrode S1 is turned on, and the gate current as shown by the broken line of above-described FIG. 3 flows between the first gate electrode G1 and the first source electrode S1. The magnitude of the gate-source current is about 1 to 2% of the first drain-source current $I_{D1S1}$, which is a main current, when the first gate-source voltage $V_{G1S1}$ is 3 V. For example, if the first drain-source current $I_{D1S1}$ is 100 A, the first gate-source current $I_{D1S1}$ is 1 to 2 A.

On the other hand, the solid line of FIG. 4 illustrates the characteristic of the gate voltage and the drain current of the configuration in which the second source electrode S2 of the MISFET 20 having the pseudo diode characteristic is connected to the first gate electrode G1 of the junction FET 10 in the first embodiment. Herein, when viewed from a gate drive circuit, the gate voltage applied to this device is the voltage applied between the second drain electrode D2 of the MISFET 20 and the first source electrode S1 of the junction FET 10 and is described as a gate-source voltage $V_{D2S1}$ of the device. The drain current of this device is the current which flows between the first drain electrode D1 and the first source electrode S1 of the junction FET 10, which is a main transistor, and is the first drain-source current $I_{D1S1}$. Thus, the solid line of FIG. 4 illustrates the characteristic of the first drain-source current $I_{D1S1}$ in the case in which the gate-source voltage of the device $V_{D2S1}$ is varied.

When viewed from the gate drive circuit, the threshold voltage 5 V of the MISFET 20 (see the characteristic of the solid line of above-described FIG. 3 and the like) is added to the threshold voltage 1 V of the single junction FET 10. Therefore, the threshold voltage of the entire device composed of the junction FET 10 and the MISFET 20 is 6 V. When a configuration of a semiconductor device like that of the first embodiment is employed in this manner, a threshold voltage of a junction FET can be improved without connecting a plurality of diodes in series. Thus, the junction FET which does not easily cause false turn-on due to noise can be achieved. As a result, characteristics of a semiconductor device having a junction FET can be improved.

The broken line on the right side of FIG. 4 shows a characteristic of the gate current which flows through the entire device when the gate-source voltage of the device $V_{D2S1}$ is varied. The gate current which flows through the entire device is a current which flows from the second drain electrode D2 of the MISFET 20 to the first source electrode S1 of the junction FET 10, which is the main transistor, and is described as a gate-source current of the device $I_{D2S1}$. The semiconductor device of the first embodiment has the characteristics such that the gate-source current of the device $I_{D2S1}$ is increased and saturated when the gate-source voltage of the device $V_{D2S1}$, which is the gate voltage of the device when viewed from the gate drive circuit, is higher than 7.5 V. The reason of the characteristics will be described below in detail.

A sum of the voltage (2.5 V) at which the pn-junction diode between the first gate electrode G1 and the first source electrode S1 of the junction FET 10 and the rising voltage (5 V) of the MISFET 20 is 7.5 V. When the gate-source voltage of the device $V_{D2S1}$ exceeds 7.5 V, the gate-source current of the device $I_{D2S1}$ becomes the same as the second drain-source current $I_{D2S2}$ which flows between the second drain electrode D2 and the second source electrode S2 of the MISFET 20 (in other words, $I_{D2S1}=I_{D2S2}$). Therefore, as illustrated by the solid line of FIG. 3, when the second drain-source current $I_{D2S2}$ has the saturation property, the gate-source current of the device $I_{D2S1}$ also has the saturation property.

As described above, according to the semiconductor device of the first embodiment, in the junction FET, the gate-source current of the device $I_{D2S1}$ has the saturation property. Therefore, even when the gate-source voltage of the device $V_{D2S1}$ becomes higher than a predetermined voltage, rapid increase in the gate current can be suppressed. Thus, load in the gate drive circuit can be reduced. As a result, the characteristics of the semiconductor device having the junction FET can be further improved.

An n-channel type MISFET 20, which is the enhancement mode in which the on-state is obtained when a positive voltage is applied to the gate, is used as the MISFET 20 of the semiconductor device of the first embodiment capable of obtaining the above-described effects. Meanwhile, the present inventor has also studied about usage of a p-channel type MISFET. In the case of the p-channel MISFET, when a positive voltage is applied to the gate, the channel is closed opposite to the n-channel MISFET; therefore, it means that a depletion (normally-on) type MISFET is connected. Furthermore, also about the diode 30, which is connected to the MISFET 20 in parallel, the polarity (the direction of the anode/cathode) is reversed. For these reasons, even when the p-channel type MISFET is used, it is difficult to obtain sufficient effects. From this point of view, in the semiconductor device of the first embodiment, using an n-channel type enhancement-type MISFET as the transistor for control is more preferable.

Figure 5:
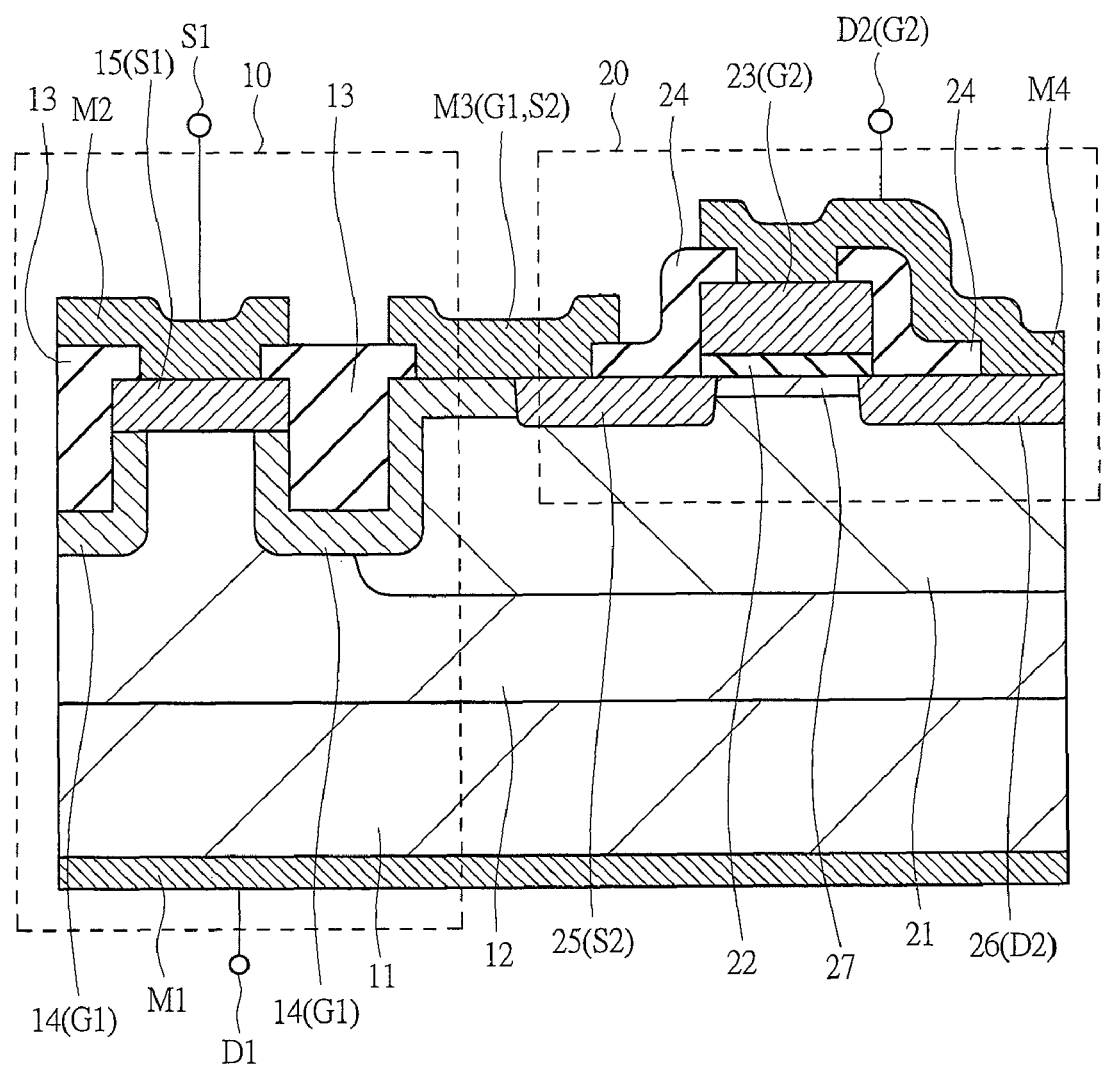
FIG. 5 is a cross-sectional view of main parts of the semiconductor device which is the first embodiment of the present invention.

A structure in which the junction FET 10 and the MISFET 20 in the semiconductor device of the first embodiment having the above-described configurations are formed on a single semiconductor chip will be described in detail. FIG. 5 illustrates a cross-sectional view of main parts of the semiconductor device of the first embodiment. In the drawing, the region surrounded by broken lines on the left side illustrates the junction FET 10 of the first embodiment, and the region surrounded by a broken line on the right side illustrates the MISFET 20 of the first embodiment. The junction FET 10 and the MISFET 20 of the first embodiment are formed on a semiconductor substrate 11. The semiconductor substrate 11 is composed of an n-type semiconductor mainly formed of SiC and has an impurity concentration of, for example, 2 to $5 \times 10^{18}$ cm$^{-3}$. Herein, only the junction FET 10 and the MISFET 20 of one unit are illustrated for brevity. However, in practice, a plurality of unillustrated units are connected in parallel in the structure. Hereinafter, components which the junction FET 10 and the MISFET 20 of the first embodiment have will be described in detail with reference to FIG. 5.

First, components which the junction FET 10 of the first embodiment has will be described in detail. The semiconductor substrate 11 functions also as a drain region of the junction FET 10. Therefore, a back-side electrode M1 formed of a conductive film is formed on a back surface of the semiconductor substrate 11. The back-side electrode M1 serves as the first drain electrode D1 of the junction FET 10.

An n-type drift layer 12, which is an n-type semiconductor region, is formed on the semiconductor substrate 11. An impurity concentration of the n-type drift layer 12 is lower than that of the semiconductor substrate 11 and is, for example, about 1 to $3 \times 10^{16}$ cm$^{-3}$. A thickness of the n-type drift layer 12 is about 5 to 10 µm.

A separation area 13 is formed in to a surface side of the n-type drift layer 12. The separation area 13 has a structure in which an insulating film formed of silicon oxide or the like is buried in a shallow trench formed in a depth direction of the n-type drift layer 12.

In the boundary part between the separation area 13 and the n-type drift layer 12, a p-type gate layer 14 is integrally formed over a part of a side-wall to a bottom part of the separation area 13 and the surface of the n-type drift layer 12. Therefore, the n-type drift layer 12 and the p-type gate layer 14 form a pn-junction in a boundary part therebetween. The p-type gate layer 14 has an impurity concentration of, for example, about 0.5 to $1 \times 10^{20}$ cm$^{-3}$. A thickness of the p-type gate layer 14 viewed from the side-wall or the bottom part of the separation area 13 is about 0.2 to 0.3 µm. The p-type gate layer 14 functions as the first gate electrode G1 of the junction FET 10 in the circuit diagram of above-described FIG. 1.

On a region within the surface of the n-type drift layer 12 on which the separation area 13 is not formed, a first n-type source layer 15 is formed. An impurity concentration of the first n-type source layer 15 is higher than that of the semiconductor substrate 11 and is, for example, about 1 to $3 \times 10^{20}$ cm$^{-3}$. The first n-type source layer 15 is formed from the surface of the n-type drift layer 12 to a position at a depth of about 0.3 to 0.4 µm. The first n-type source layer 15 is formed so as to be in contact with the p-type gate layer 14, thereby forming pn-junction at this part. The first n-type source layer 15 functions as the first source electrode S1 of the junction FET 10 in the circuit diagram of above-described FIG. 1.

A first surface electrode M2 formed of a conductive film is formed on the surface of the first n-type source layer 15. The first surface electrode M2 serves as the first source electrode S1 of the junction FET 10. On a part of the p-type gate layer 14 which is exposed on the surface of the n-type drift layer 12, a second surface electrode M3 formed of a conductive film is formed. The second surface electrode M3 functions as the first gate electrode G1 of the junction FET 10. Herein, in the semiconductor device of the first embodiment, as described above, the first gate electrode G1 of the junction FET 10 and the second source electrode S2 of the MISFET 20 are connected to each other by short-circuiting. Therefore, the second surface electrode M3, which functions as the first gate electrode G1 of the junction FET 10, also functions as the second source electrode S2 of the MISFET 20. This structure will be described in more detail after the structure of the MISFET 20 is described below.

The structure of the junction FET 10, which is the main transistor in the semiconductor device of the first embodiment, has been described above. Since all of the first n-type source layer 15, the n-type drift layer 12, and the semiconductor substrate 11 are semiconductor regions of n-type, a current flows therethrough when a potential difference is applied between the first surface electrode M2 and the back-side electrode M1. In this case, a depletion layer generated in the n-type drift layer 12 from the p-type gate layer 14 can be controlled by controlling a voltage applied to the second surface electrode M3, which is in conduction with the p-type gate layer 14. Expansion of the depletion layer changes the conduction region of the n-type drift layer 12, so that the current amount can be controlled.

Next, components which the MISFET 20 of the first embodiment has will be described in detail. In the semiconductor device of the first embodiment, on the same semiconductor substrate 11 as that of the junction FET 10, the MISFET 20 is formed in a region which is not planarly overlapped with but adjacent with the junction FET 10. A p-type well layer 21 is formed in the region for forming the MISFET 20 of the n-type drift layer 12 on the semiconductor substrate. The p-type well layer 21 has an impurity concentration of, for example, about 2 to $5 \times 10^{17}$ cm$^{-3}$ and is formed to a position having a depth of about 1 to 1.5 µm from a surface thereof. The MISFET 20 of the first embodiment is formed in the p-type well layer 21. The MISFET 20 is isolated from the n-type drift layer 12 by this p-type well layer 21.

A gate electrode 23 composed of a conductive film mainly formed of polycrystalline silicon is formed on a part of a surface of the p-type well layer 21 interposing a gate insulating film 22 composed of an insulating film mainly formed of silicon oxide. The gate electrode 23 functions as the second gate electrode G2 of the MISFET 20 in the circuit diagram of above-described FIG. 1. A side-wall spacer 24 for insulating and isolating the gate electrode 23 from other members is formed on side-walls of the gate electrode 23. The side-wall spacer 24 is composed of an insulating film mainly formed of silicon oxide.

A second n-type source layer 25 and a second n-type drain layer 26 are formed on the surface of the p-type well layer 21 that is positioned at side lower portions of the gate electrode 23. Herein, the second n-type source layer 25 is formed at one of the side lower portions of the gate electrode 23, and the second n-type drain layer 26 is formed at the other side lower portion. The second n-type source and drain layers 25 and 26 are formed by the specifications which are similar to that of the first n-type source layer 15, in which the impurity concentration is, for example, about 1 to $3 \times 10^{20}$ cm$^{-3}$, and formed up to a position having a depth of about 0.3 to 0.4 μm from the surface of the p-type well layer 21. The second n-type source layer 25 and the second n-type drain layer 26 function as the second source electrode S2 and the second drain electrode D2, respectively, in the MISFET 20 of the circuit diagram of above-described FIG. 1.

A channel layer 27 is formed in a region of a part below the gate insulating film 22, the region being at the surface of the p-type well layer 21 and planarly sandwiched by the second n-type source and drain layers 25 and 26, so that the channel layer is electrically connected to the second n-type source and drain layers 25 and 26. This is a region in which a channel for current flowing is to be formed in the operation of the MISFET 20, and an impurity concentration to be set is changed depending on required characteristics.

Herein, in the MISFET 20 of the first embodiment, the above-described configuration is formed so that the second n-type source layer 25 is disposed at a position closer to the region where the junction FET 10 is formed than the second n-type drain layer 26. Particularly, the p-type gate layer 14 of the junction FET 10 and the second n-type source layer 25 of the MISFET 20 are joined with each other at the ends thereof. Furthermore, the p-type gate layer 14 of the junction FET 10 is disposed so as to have a part being contacted with the p-type well layer 21. Thus, since both the p-type gate layer 14 and the p-type well layer 21 are p-type semiconductor regions, both of them are connected at the same electrical potential.

The second surface electrode M3 covering the surface of the p-type gate layer 14 of the junction FET 10 in the above-described manner is formed so as to also cover the surface of the second n-type source layer 25 of the MISFET 20. As a result, the p-type gate layer 14 of the junction FET 10 and the second n-type source layer 25 of the MISFET 20 are connected to each other by short-circuiting through the second surface electrode M3. The second n-type source layer 25 of the MISFET 20 is the region which functions as the source of the MISFET 20; therefore, the second surface electrode M3 in conduction with the region also functions as the second source electrode S2 of the MISFET 20. In the above-described manner, the structure in which the second source electrode S2 of the MISFET 20 is electrically connected to the first gate electrode G1 of the junction FET 10, which is the main transistor, as described with reference to FIG. 1 described above, can be achieved.

In the MISFET 20 of the first embodiment, a third surface electrode M4 is formed so as to be electrically connected to both the gate electrode 23 and the second n-type drain layer 26 and so as to planarly cross over the side-wall spacer 24. In other words, the gate electrode 23 (the second gate electrode G2 of above-described FIG. 1) of the MISFET 20 and the second n-type drain layer 26 of the MISFET 20 are connected to each other by short-circuiting through the third surface electrode M4. Thus, the third surface electrode M4 functions as the second drain electrode D2 in above-described FIG. 1. In the above-described manner, as is described with reference to FIG. 1 described above, the structure of the MISFET 20 in which the second gate electrode G2 and the second drain electrode D2 are connected by short-circuiting can be achieved in the semiconductor device of the first embodiment. As described above, the MISFET in which the gate electrode and the drain electrode are connected by short-circuiting in this manner operates as a pseudo diode.

In the above-described manner, the structure in which the junction FET 10 and the MISFET 20 that operates as a pseudo diode are provided on the same semiconductor substrate 11, and the p-type gate layer 14 (first gate electrode G1) and the second n-type source layer 25 (second source electrode S2) are connected by short-circuiting can be achieved. Thus, the semiconductor device of the first embodiment having the effects described with reference to FIG. 1 to FIG. 4 described above can be actually formed.

Particularly, when the junction FET 10 and the MISFET 20 are disposed on the same semiconductor substrate 11 like the semiconductor device of the first embodiment, the wiring length can be shortened. For example, the possibility of the occurrence of false turn-on can be further lowered by shortening the second surface electrode M3, which mutually connects the p-type gate layer 14 of the junction FET 10 and the second n-type source layer 25 of the MISFET 20 by short-circuiting to reduce the wiring inductance of this part. As a result, the characteristics of the semiconductor device having the junction FET can be further improved.

A method of manufacturing the semiconductor device of the first embodiment having the structure described with reference to FIG. 5 described above will be described in detail. The following steps are carried out so that the specifications such as thickness, impurity concentration, and the like of the components are the same as the specifications described with reference to FIG. 5 described above.

Figure 6:
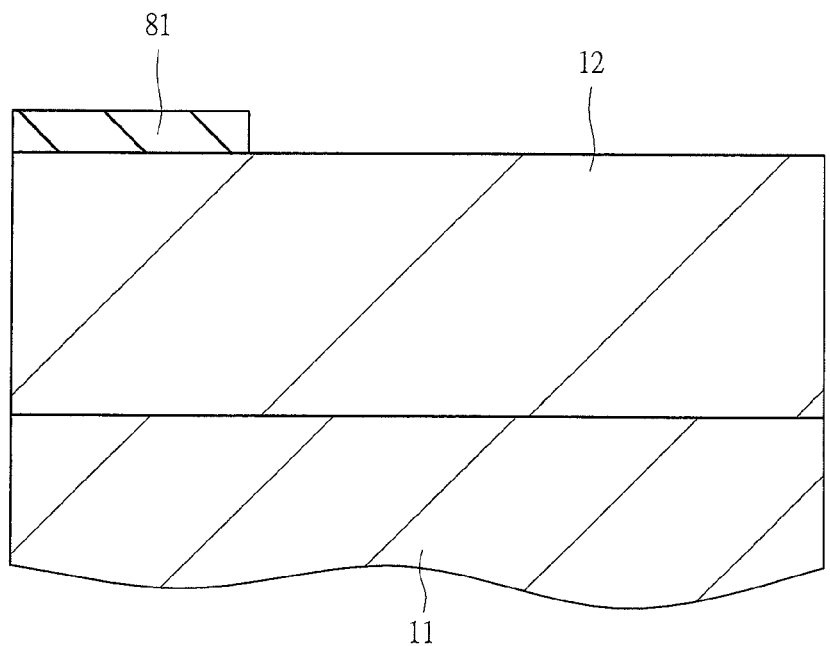
FIG. 6 is a cross-sectional view of main parts of the semiconductor device which is the first embodiment of the present invention in a manufacturing process.

As illustrated in FIG. 6, the n-type drift layer 12 is formed on the semiconductor substrate 11 formed of a semiconductor mainly made of SiC. Herein, the semiconductor substrate 11 of n-type and having an impurity concentration of about 2 to $5 \times 10^{18}$ cm$^{-3}$ is used. About 5 to 10 μm of the n-type drift layer 12 which is n-type and has an impurity concentration of about 1 to $3 \times 10^{16}$ cm$^{-3}$ is formed, for example, by an epitaxial growth method.

Then, a silicon oxide film 81 composed of an insulating film mainly formed of silicon oxide is formed on the n-type drift layer 12. The silicon oxide film 81 is formed, for example, by a chemical vapor deposition (CVD) method. Subsequently, the silicon oxide film 81 is subjected to patterning so that a desired region is opened by a photo-lithography method and an etching method. More specifically, first, a photo-resist film (not illustrated) is applied onto the silicon oxide film 81, and a desired pattern is transferred to the photo-resist film by carrying out a series of photo-lithography steps such as masking, exposure, and development. Then, the exposed part of the silicon oxide film 81 is subjected to etching to be removed with using the photo-resist film as an etching mask, thereby patterning the silicon oxide film 81. Hereinafter, the steps of patterning formed films are assumed to be similar to this.

Herein, the desired region in which the silicon oxide film 81 is opened is a part of the silicon oxide film 81 which will cover a region in which the p-type well layer 21 (see above-described FIG. 5) will be formed in the n-type drift layer 12 in a later step. As is described below in detail, the p-type well layer 21 is formed by carrying out ion implantation using the silicon oxide film 81 as a mask for ion-implantation. At this point, a photo-resist film may be formed as the mask for ion-implantation. However, forming the silicon oxide film 81 in the above-described manner is more preferable as a more stable mask for ion-implantation for the ion implantation step.

Figure 7:
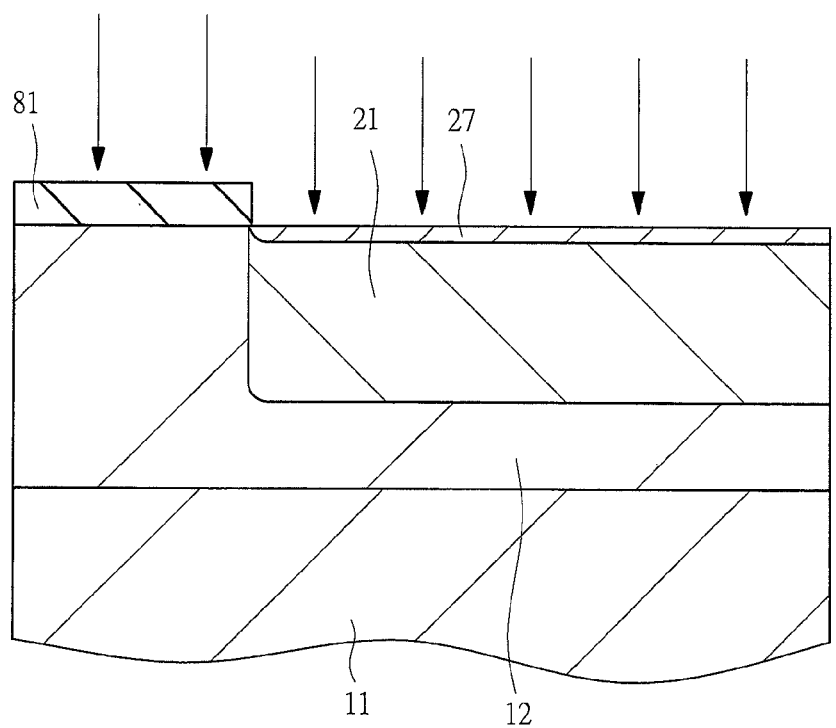
FIG. 7 is a cross-sectional view of main parts of the semiconductor device in the manufacturing process continued from FIG. 6.

Next, as illustrated in FIG. 7, the n-type drift layer 12 is subjected to ion implantation with using the silicon oxide film 81 as a mask for ion-implantation, thereby forming the p-type well layer 21. Note that, hereinafter, the wording "surface of the p-type well layer 21" means "surface of the n-type drift layer 12" as well. At this point, aluminum ions are implanted so that the p-type well layer 21 has an impurity concentration of about 2 to $5 \times 10^{17}$ cm$^{-3}$ and a depth of about 1 to 1.5 μm. The impurity introduced into the semiconductor region by the ion implantation is activated when a thermal treatment is carried out, thereby obtaining a desired impurity concentration. Also, when the impurity diffuses in the semiconductor region by the thermal treatment, the thickness and the depth are determined. Hereinafter, unless otherwise stated, setting values obtained after all thermal treatment is finished are described as the concentration of the impurity introduced by ion implantation, the depth or the thickness of the semiconductor regions formed thereby, and so forth.

Subsequently, the n-type drift layer 12 is subjected to ion implantation with using the same silicon oxide film 81 as a mask for ion-implantation, thereby forming the channel layer 27. A setting value of the impurity concentration of the channel layer 27 is determined by the electric characteristics of the MISFET 20, and the concentration affects, for example, the threshold voltage. Herein, as an example, the n-type conductivity is achieved by implanting nitrogen ions so that the impurity concentration is about 0.1 to $1 \times 10^{17}$ cm$^{-3}$. Also, the ion implantation is carried out so that the depth is about 1 to 1.5 μm. After the ion implantation step is finished, the silicon oxide film 81 is removed.

Figure 8:
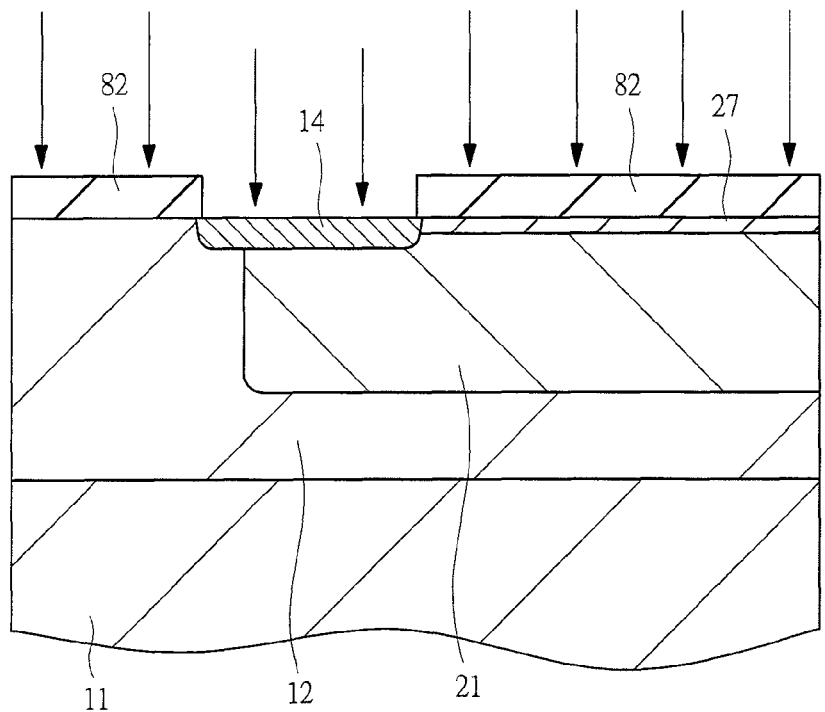
FIG. 8 is a cross-sectional view of main parts of the semiconductor device in the manufacturing process continued from FIG. 7.

Next, as illustrated in FIG. 8, a silicon oxide film 82 is formed again on the n-type drift layer 12 and subjected to patterning so that a desired region is opened. Herein, the desired region of the silicon oxide film 82 to be opened is a part of the silicon oxide film 82 covering the region where a part of the p-type gate layer 14 will be disposed on the surface of the n-type drift layer 12 in a later step.

Then, the n-type drift layer 12 is subjected to ion implantation with using the silicon oxide film 82 as a mask for ion-implantation, thereby forming the p-type gate layer 14. Herein, aluminum ions are implanted so that the p-type gate layer 14 has an impurity concentration of about 0.5 to $1 \times 10^{20}$ cm$^{-3}$ and a depth of about 0.2 to 0.3 μm. The p-type gate layer 14 formed herein is a part of the p-type gate layer 14 having an intended structure. After the ion implantation step is finished, the silicon oxide film 82 is removed.

Figure 9:
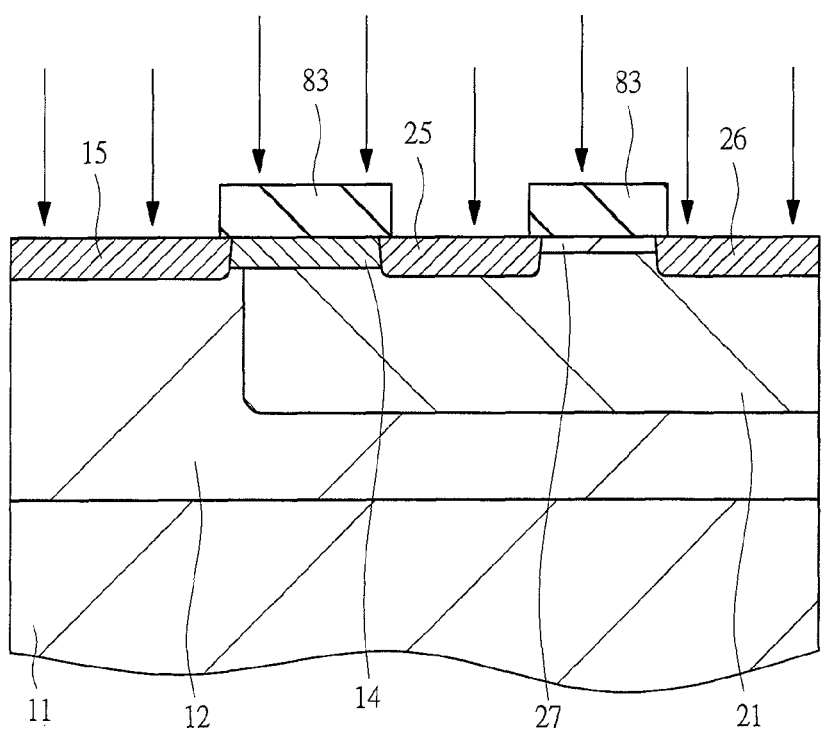
FIG. 9 is a cross-sectional view of main parts of the semiconductor device in the manufacturing process continued from FIG. 8.

Next, as illustrated in FIG. 9, a silicon oxide film 83 is formed again on the n-type drift layer 12 and subjected to patterning so that desired regions are opened. Herein, the desired regions of the silicon oxide film 83 to be opened are parts of the silicon oxide film 83 covering the regions where the first n-type source layer 15, the second n-type source layer 25, and the second n-type drain layer 26 will be formed in a later step.

Then, the n-type drift layer 12 is subjected to ion implantation with using the silicon oxide film 83 as a mask for ion-implantation, thereby forming the first n-type source layer 15, the second n-type source layer 25, and the second n-type drain layer 26. Herein, nitrogen ions are implanted so that the first n-type source layer 15, the second n-type source layer 25, and the second n-type drain layer 26 have an impurity concentration of about 1 to $3 \times 10^{20}$ cm$^{-3}$ and a depth of about 0.3 to 0.4 μm. In the above description, the ion implantation for forming the first n-type source layer 15, the second n-type source layer 25, and the second n-type drain layer 26 has been described as the same step; however, these layers may be formed in different steps. In that case, masks for ion-implantation using the silicon oxide film 83 are separately formed, and ion implantation is carried out under different conditions. However, if the specifications such as the impurity concentration, depth, and so forth of the first n-type source layer 15, the second n-type source layer 25, and the second n-type drain layer 26 are the same, carrying out the ion implantation in the same step as described above is more preferable. This is for the reason that the number of steps can be reduced by doing so. After the ion implantation step is finished, the silicon oxide film 83 is removed.

Figure 10:
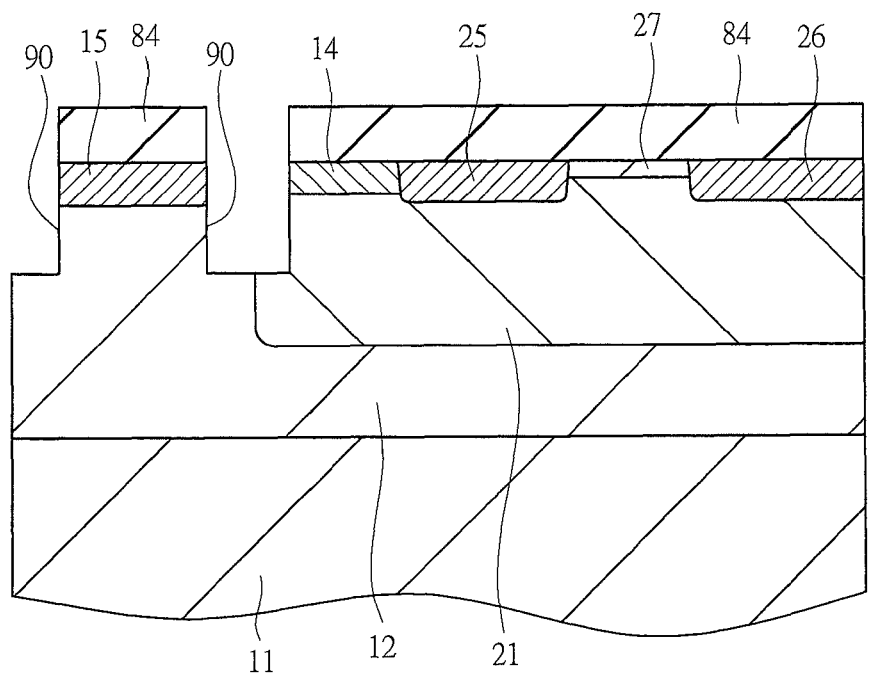
FIG. 10 is a cross-sectional view of main parts of the semiconductor device in the manufacturing process continued from FIG. 9.

Next, as illustrated in FIG. 10, a silicon oxide film 84 is formed again on the n-type drift layer 12 and subjected to patterning so that desired regions are opened. Herein, the desired regions of the silicon oxide film 84 to be opened are parts of the silicon oxide film 84 covering regions where the separation areas 13 (see above-described FIG. 5) will be to be formed in a later step.

Then, the n-type drift layer 12 is subjected to dry etching with using the silicon oxide film 84 as an etching mask. As a result, a trench 90 recessed in the depth direction of the n-type drift layer 12 is formed. Herein, the trench 90 is formed to have a depth of about 0.8 to 1 μm.

Figure 11:
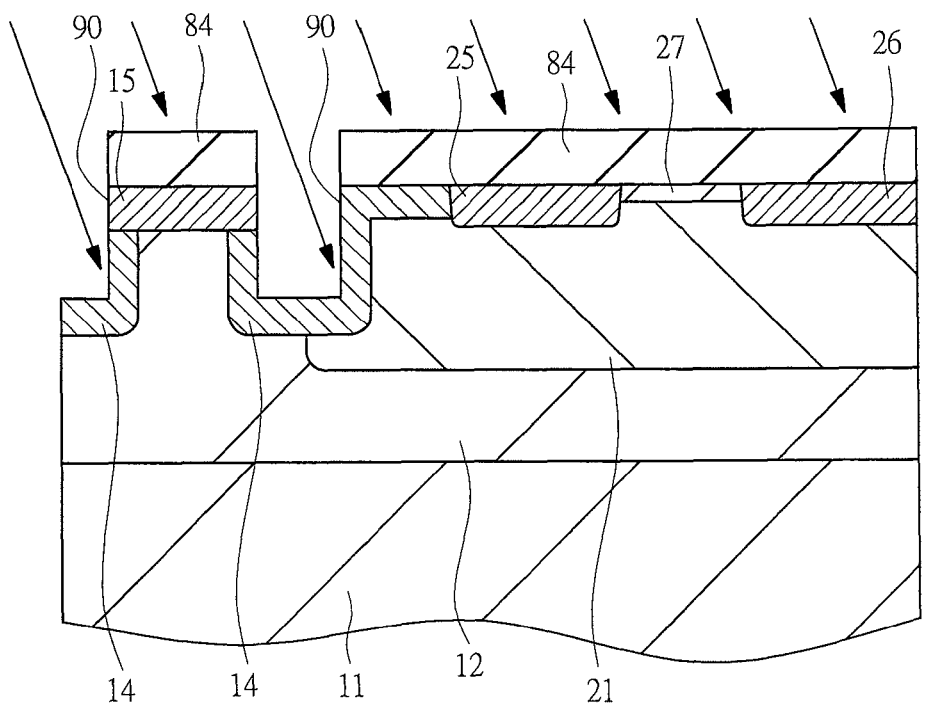
FIG. 11 is a cross-sectional view of main parts of the semiconductor device in the manufacturing process continued from FIG. 10.

Next, as illustrated in FIG. 11, a side-wall and a bottom part of the trench 90 are subjected to ion implantation with using the silicon oxide film 84, which has been used as the etching mask for forming the trench 90, as a mask for ion-implantation, thereby forming the p-type gate layer 14. Herein, the p-type gate layer 14 is formed integrally from the side-wall to the bottom part of the trench 90 so that the impurity concentration is about 2 to $5 \times 10^{18}$ cm$^{-3}$. In order to subject not only the bottom part of the trench 90 but also the side-wall to ion implantation as described above, applying oblique ion implantation is more preferable. In practice, the integrated p-type gate layer 14 is formed from part of the side-wall of the trench 90 and over the bottom part by carrying out both the ion implantation vertical to the plane of the semiconductor substrate 11 and the ion implantation oblique to the same. As a result of this step, the p-type gate layer 14, which has been already formed in the step of above-described FIG. 8 and disposed on the surface of the p-type well layer 21, and the p-type gate layer 14 formed on the side-wall and the bottom part of the trench 90 in the present step are electrically connected with each other, so that the p-type gate layer 14 is integrally formed. In other words, the p-type gate layer 14 is integrally formed from the part of the side-wall of the trench 90 to the bottom part and until the surface of the p-type well layer 21. After the ion implantation step is finished, the silicon oxide film 84 is removed.

After the foregoing step finished, a thermal treatment is carried out at 1700° C. to activate the impurity ions implanted in the previous step.

Figure 12:
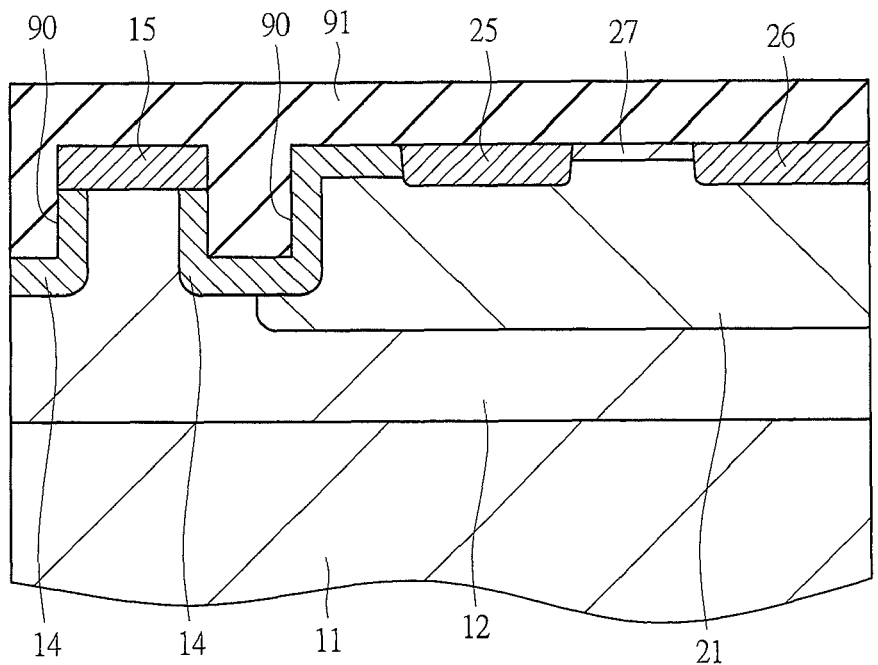
FIG. 12 is a cross-sectional view of main parts of the semiconductor device in the manufacturing process continued from FIG. 11.

Next, as illustrated in FIG. 12, a silicon oxide film 91, which is an insulating film mainly formed of silicon oxide, is formed so as to fill the trench 90 from the surface side of the semiconductor substrate 11. The silicon oxide film 91 is formed, for example, by a thermal oxidation method or a CVD method.

Figure 13:
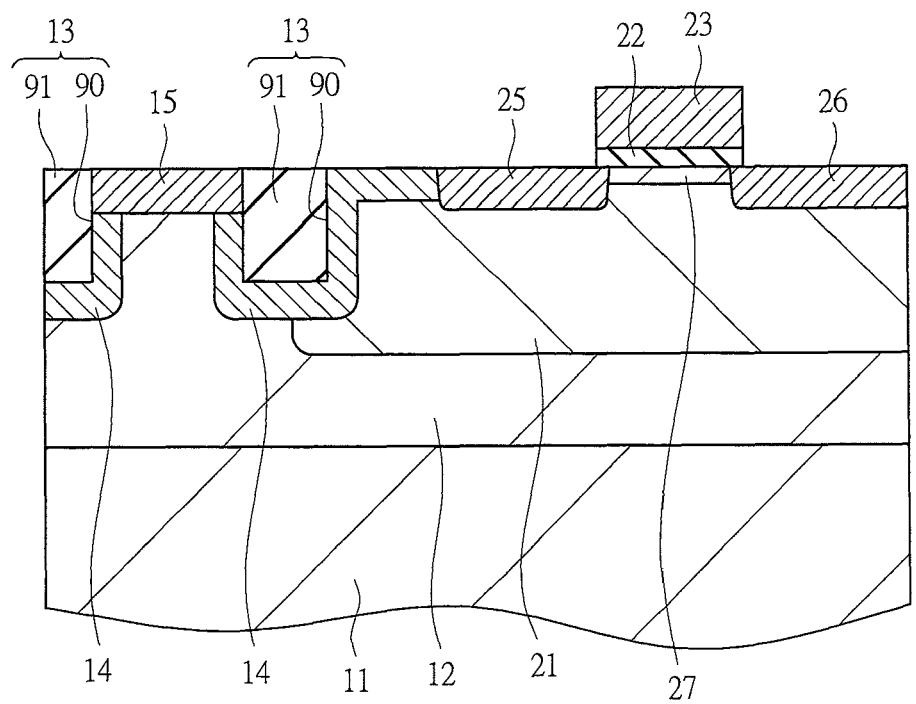
FIG. 13 is a cross-sectional view of main parts of the semiconductor device in the manufacturing process continued from FIG. 12.

Next, as illustrated in FIG. 13, the silicon oxide film 91 formed in the previous step is subjected to etch back, thereby removing part of the silicon oxide film 91 except for that formed in the trench 90. In this manner, the shallow-trench type separation area 13 composed of the trench 90 and the silicon oxide film 91 filling the trench 90 is formed.

Subsequently, the gate insulating film 22 composed of an insulating film mainly formed of silicon oxide is formed by a thermal oxidation method. Then, the gate electrode 23 composed of a conductive film mainly formed of polycrystalline silicon is formed on the gate insulating film 22 by a CVD method. Then, these are processed into desired shapes, for example, by a photo-lithography method and a dry etching method. Herein, the gate insulating film 22 and the gate electrode 23 are the components of the MISFET 20 described with reference to FIG. 5 described above and are processed so as to have the structure described in FIG. 5. More specifically, the gate insulating film 22 and the gate electrode 23 are processed so as to remain in the manner covering the channel layer 27 and so that the second n-type source and drain layers 25 and 26 are disposed at side lower portions thereof.

Figure 14:
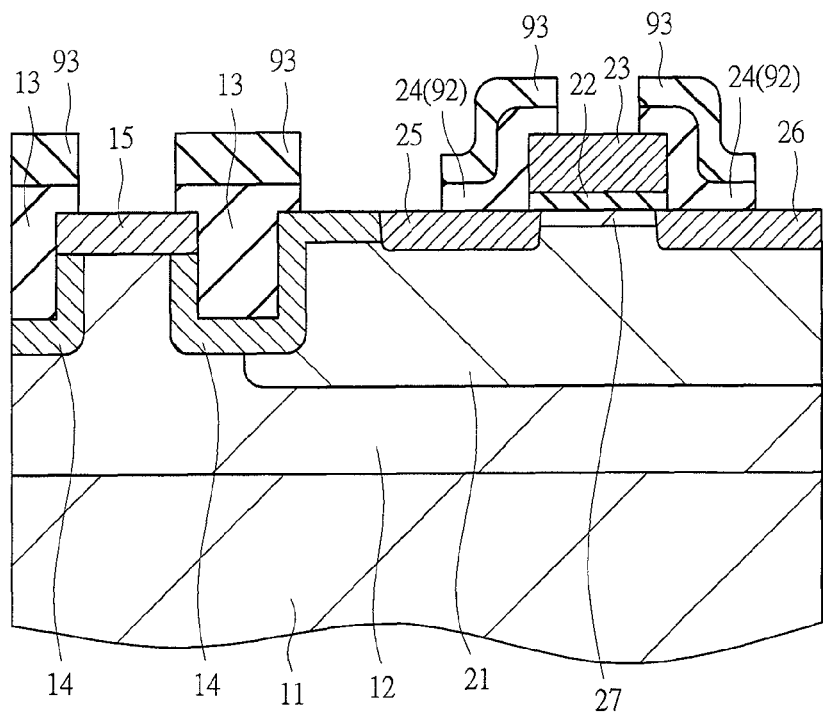
FIG. 14 is a cross-sectional view of main parts of the semiconductor device in the manufacturing process continued from FIG. 13.

Next, as illustrated in FIG. 14, a silicon oxide film 92 is formed from the surface side of the semiconductor substrate 11 by a CVD method so as to integrally cover the structure formed as described above. The silicon oxide film 92 is formed to insulate and isolate the conductor parts such as electrodes. Therefore, in a subsequent step, the silicon oxide film 92 is processed, for example, by dry etching so that the silicon oxide film 92 remains at necessary parts. Herein, the silicon oxide film 92 has to remain as the side-wall spacer 24 on the side-wall part of the gate electrode 23. Therefore, a photo-resist film 93 is formed as an etching mask for protecting the silicon oxide film 92 in this region from etching. In this process, since the separation area 13 formed in the step is also formed of a silicon oxide film, the separation area 13 has to be protected from the etching in order to prevent the part from being removed. Therefore, the photo-resist film 93 is patterned by, for example, a photo-lithography method so as to cover the silicon oxide film 92 at the side-wall part of the gate electrode 23 and cover the separation area 13.

Subsequently, the silicon oxide film 92 is subjected to dry etching with using the photo-resist film 93 as an etching mask, thereby forming the side-wall spacer 24 composed of the silicon oxide film 92 covering the side-wall of the gate electrode 23. In this process, the separation area 13 is protected by the photo-resist film 93 and remains without being subjected to the etching. After the etching step is finished, the photo-resist film 93 is removed.

Figure 15:
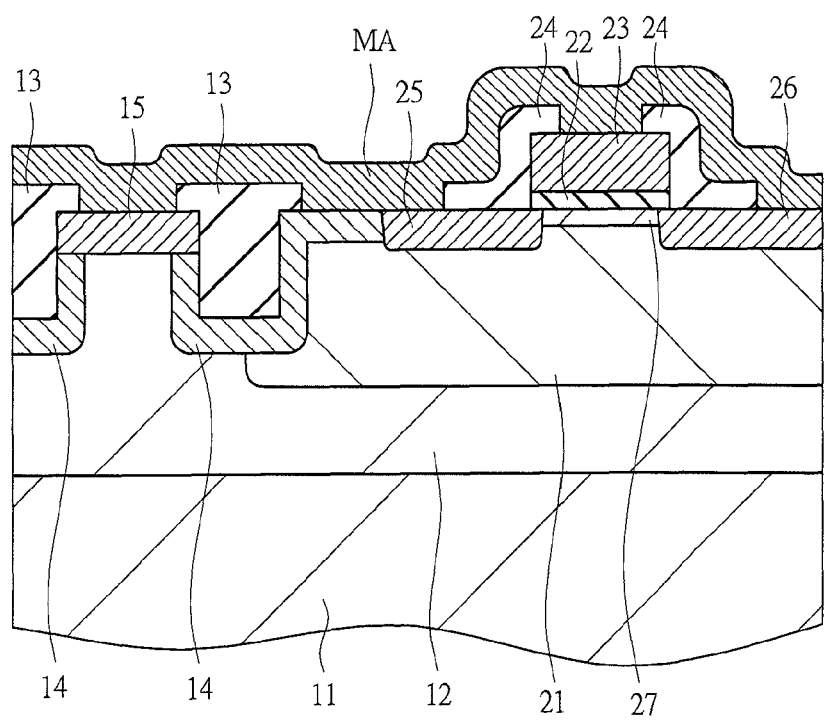
FIG. 15 is a cross-sectional view of main parts of the semiconductor device in the manufacturing process continued from FIG. 14.

Next, as illustrated in FIG. 15, a surface electrode film MA is formed so as to integrally cover the structure formed in the foregoing description from the surface side of the semiconductor substrate 11. For example, stacked films of about 50 nm of a nickel (Ni) film and about 0.3 μm of an aluminum film are formed by, for example, a sputtering method as the surface electrode film MA. Then, when a thermal treatment is carried out, the parts at which silicon and the nickel film are in contact with each other are changed into Ni silicide. As a result, contact resistances of the surface electrode film MA and respective members can be reduced. The parts at which silicon and the nickel film are in contact with each other are the surface of the first n-type source layer 15, the surfaces of the p-type gate layer 14 and the second n-type source layer 25, and the surfaces of the gate electrode 23 and the second n-type drain layer 26.

Figure 16:
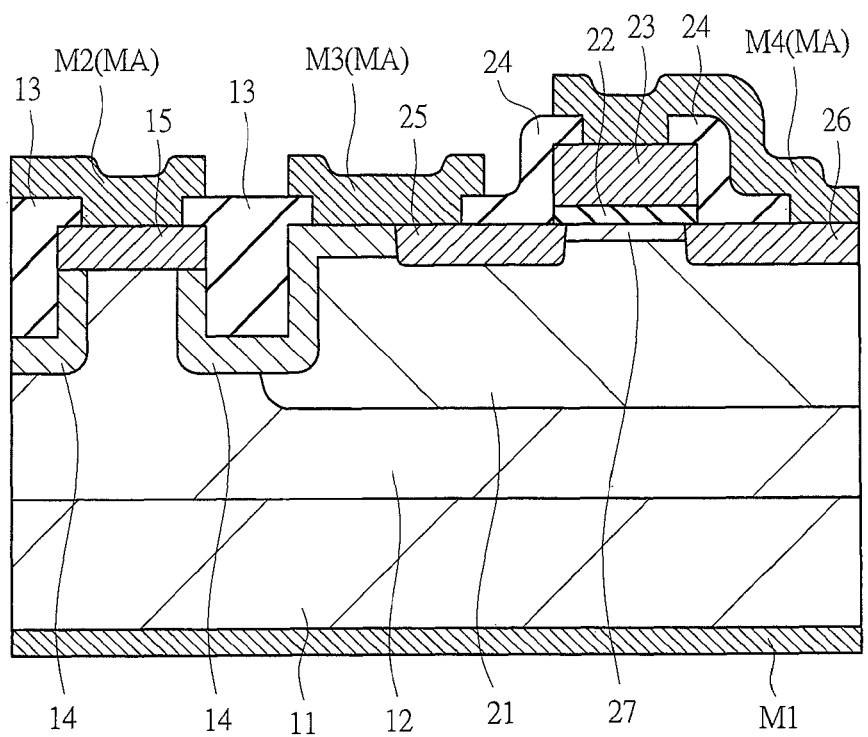
FIG. 16 is a cross-sectional view of main parts of the semiconductor device in the manufacturing process continued from FIG. 15.

Next, as illustrated in FIG. 16, the surface electrode film MA is subjected to patterning. Particularly, the surface electrode film MA is patterned so as to be separated into the first surface electrode M2 which is in conduction with the first n-type source layer 15, the second surface electrode M3 which is integrally in conduction with the p-type gate layer 14 and the second n-type source layer 25, and the third surface electrode M4 which is integrally in conduction with the gate electrode 23 and the second n-type drain layer 26.

Then, the back surface of the semiconductor substrate 11 is ground, for example, by back-side grinding and an etching method, thereby causing the semiconductor substrate 11 to have a desired thickness. Subsequently, in a manner similar to that of the surface electrode film MA of above-described FIG. 15, the back-side electrode M1 is formed on the back surface of the semiconductor substrate 11. However, these backside grinding processes do not have to be needed to realize present invention.

In the above-described manner, the semiconductor device of the structure described with reference to FIG. 5 described above having the junction FET 10 and the MISFET 20 disposed on the same semiconductor substrate 11 can be formed.

According to examinations carried out by the present inventor, when the channel layer 27 was not formed, the rising voltage was higher than 10 V. Therefore, the structure in which the channel layer 27 was provided was used like the MISFET 20 of the first embodiment, and the rising voltage was adjusted to be 5 V. This is illustrated in FIG. 2 as the drain current-voltage characteristic of the MISFET 20 of the first embodiment. When the voltage (equal to the voltage of the gate electrode 23) of the second drain electrode D2 (third surface electrode M4) of the MISFET 20 was 9 V, the drain current of the MISFET 20 was 0.5 A.

Moreover, according to the examinations carried out by the present inventor, the characteristic between the first drain-source current $I_{D1S1}$ and the first gate-source voltage $V_{G1S1}$ of the single junction FET 10 is illustrated by the dotted line on the left side of above-described FIG. 4, and the threshold voltage was 1.2 V. When the voltage (first gate-source voltage $V_{G1S1}$) of the short-circuit electrode (second surface electrode M3 in above-described FIG. 5) serving as the first gate electrode G1 of the junction FET 10 was 2.5 V and the voltage of the first drain electrode D1 (back-side electrode M1 in above-described FIG. 5) was 1 V, the first drain-source current $I_{D1S1}$ of the junction FET 10 was 100 A.

In the case of a composite semiconductor device having the cross sectional structure of the first embodiment (see above-described FIG. 5) in which the junction FET 10 and the MISFET 20 are combined, a voltage from an external gate drive circuit is applied to the third surface electrode M4 of the MISFET 20. Then, this voltage is shared among the p-type gate layer 14 and the first n-type source layer 15 of the junction FET 10 and the second n-type drain layer 26 and the second n-type source layer 25 of the MISFET 20. As a result, the first drain-source current $I_{D1S1}$ with respect to the gate-source voltage of the device $V_{D2S1}$ viewed from the external drive circuit is shifted to the high-voltage side compared with the case of the single junction FET 10 as illustrated by the solid line in above-described FIG. 4. More specifically, the threshold voltage can be improved to 6.2 V. When the output voltage of the external drive circuit was caused to be 7.5 V, the first gate-source voltage $V_{G1S1}$ of the junction FET 10 was 2.5 V, and a drain current of the composite semiconductor device which is a main current (corresponds to the first drain-source current $I_{D1S1}$) was 100 A. An On resistance at this point was 2.5 mΩcm².

Moreover, as described above, the second drain-source current $I_{D2S2}$ of the MISFET 20 has the saturation property. Therefore, a gate current of the composite semiconductor device viewed from the external drive circuit (corresponds to the gate-source current of the device $I_{D2S1}$) also has the saturation property as illustrated by the broken line on the right side in above-described FIG. 4. Even when the voltage of the gate drive circuit is 10 V, the second drain-source voltage $V_{D2S2}$ of the MISFET 20 is 7.4 V (point "A" in above-described FIG. 3) because of the voltage sharing. As a result, the first gate-source voltage $V_{G1S1}$ of the junction FET 10 is not higher than 2.6 V (point "B" in above-described FIG. 3). According to the examinations carried out by the present inventor, for example, when the voltage of the second drain electrode D2 (the third surface electrode M4 in above-described FIG. 5) of the MISFET 20 was 7.4 V, the second drain-source current $I_{D2S2}$ of the MISFET 20 was 0.3 A (current I1 in above-described FIG. 3). Therefore, the gate current of the composite semiconductor device viewed from the external drive at this point (corresponds to the gate-source current of the device $I_{D2S1}$) was suppressed to 0.3 A (current I2 in above-described FIG. 4).

Moreover, the role of the diode 30 connected in parallel to the MISFET 20 in the semiconductor device of the first embodiment is applied for accelerating the transition from the on-state to the Off-state. This will be described below in detail.

An example in which the potential of the second drain electrode D2 is set to be lower than that of the first source electrode S1 will be described with reference to FIG. 1 described above. In this example, the MISFET 20 is in the off-state since the second gate electrode G2 and the second drain electrode D2 are connected to each other by short-circuiting in the MISFET 20 of the first embodiment. At this point, if the diode 30 is not provided, the potential of the second source electrode S2 (i.e., the first gate electrode G1 of the junction FET 10) is not fixed. When the diode 30 is provided in the manner described in the first embodiment, the potential of the second source electrode S2 is fixed since the diode 30 is in a forward bias state. The forward bias state correspond to the state in which the potential of the first gate electrode G1 is higher than the potential of the first source electrode S1. Therefore, in view of the part between the second drain electrode D2 and the first source electrode S1, this part is in a state in which two diodes of opposite polarities are connected in series; therefore, no current flows between the second drain electrode D2 and the first source electrode S1 via these diodes. In the semiconductor device of the first embodiment, the structure in above-described FIG. 5 is the structure for achieving this capable of achieving high speed operation of turn-off.

(Second Embodiment)

A semiconductor device of a second embodiment has a composite semiconductor device composed of the junction FET 10 and the MISFET 20 as described with reference to the circuit diagram of FIG. 1 described above in the same manner as the semiconductor device of the first embodiment.

Figure 17:
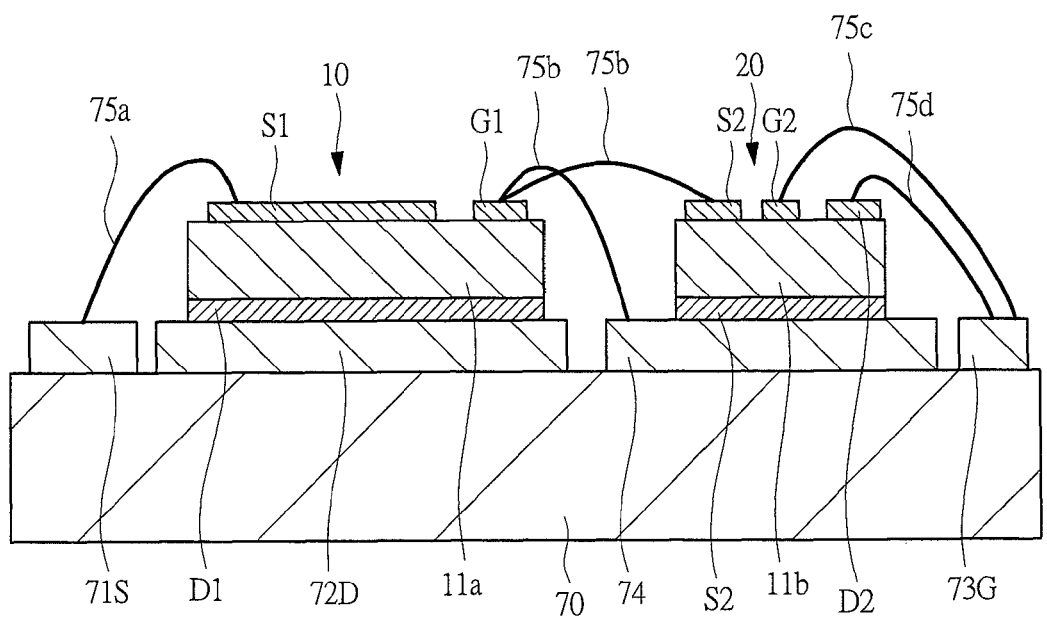
FIG. 17 is a cross-sectional view of main parts of a semiconductor device which is a second embodiment of the present invention.

A cross-sectional view of main parts of the semiconductor device of the second embodiment is illustrated in FIG. 17. In the semiconductor device of the second embodiment, the junction FET 10 and the MISFET 20 are formed on different semiconductor substrates (chips). The junction FET 10 is formed on a first semiconductor substrate 11a, and the MISFET 20 is formed on a second semiconductor substrate 11b. These two semiconductor substrates 11a and 11b are mounted on the same base plate 70 by solder-bonding. The two semiconductor substrates 11a and 11b are sealed in the same package. Hereinafter, the structure of the semiconductor device of the second embodiment will be described in more detail.

The junction FET 10 of the second embodiment is a structure similar to the part of the junction FET 10 shown on the left side in above-described FIG. 5 formed on the first semiconductor substrate 11a mainly composed of SiC. The MISFET 20 of the second embodiment is a structure similar to the part of the MISFET 20 shown on the right side in above-described FIG. 5 formed on the second semiconductor substrate 11b mainly composed of SiC. However, in the MISFET 20 of the second embodiment, a substrate mainly composed of p-type silicon may be used as the second semiconductor substrate 11b. This is for the reason that, in the semiconductor device of the second embodiment, a necessary current capacity is about 1 A, and about 30 V is enough as the breakdown voltage of the MISFET 20.

The base plate 70 has an insulating layer on an upper part thereof. The first semiconductor substrate 11a having the junction FET 10 and the second semiconductor substrate 11b having the MISFET 20 are disposed on the base plate 70. Moreover, a source terminal electrode 71S connected to a source terminal of the package, a drain terminal electrode 72D connected to a drain terminal of the package, a gate terminal electrode 73G connected to a gate terminal of the package, and an intermediate terminal electrode 74 not connected to the outside of the package are disposed on the base plate 70. The junction FET 10 and the MISFET 20 can constitute a circuit via these terminal electrodes 71S, 72D, 73G, and 74 and can be electrically connected to the outside of the package.

In the junction FET 10, the first semiconductor substrate 11a has the first source electrode S1 and the first gate electrode G1 on an upper surface thereof and has the first drain electrode D1 on a lower surface thereof. In the MISFET 20, the second semiconductor substrate 11b has the second drain electrode D2 and the second gate electrode G2 on an upper surface thereof and has the second source electrode S2 at two locations on the upper surface and a lower surface thereof.

In the junction FET 10, the first drain electrode D1 on the lower surface of the first semiconductor substrate 11a is electrically connected to the drain terminal electrode 72D, which is on the base plate 70, by solder-bonding. In the MISFET 20, the second source electrode S2 on the lower surface of the second semiconductor substrate 11b is electrically connected to the intermediate terminal electrode 74, which is on the base plate 70, by solder-bonding. In the junction FET 10, the first source electrode S1 on the upper surface of the first semiconductor substrate 11a is electrically connected to the source terminal electrode 71S, which is on the base plate 70, by a metal wire 75a.

Furthermore, in the semiconductor device of the second embodiment, in the junction FET 10, the first gate electrode G1 on the upper surface of the first semiconductor substrate 11a is electrically connected to the second source electrodes S2 of the MISFET 20, which are formed on the second semiconductor substrate 11b, by two metal wires 75b. One of the connections is between the first gate electrode G1 and the intermediate terminal electrode 74 on the base plate 70 connected by the metal wire 75b. As a result, the first gate electrode G1 is electrically connected to the second source electrode S2 on the lower surface of the second semiconductor substrate 11b via the intermediate terminal electrode 74. The other connection is between the first gate electrode G1 and the second source electrode S2 on the upper surface of the second semiconductor substrate 11b, which is provided with the MISFET 20, by the metal wire 75b. As a result, the structure in which the first gate electrode G1 of the junction FET 10 and the second source electrodes S2 of the MISFET 20 are connected to each other by short-circuiting in the structure described with reference to the circuit diagram of above-described FIG. 1 is achieved.

Furthermore, in the semiconductor device of the second embodiment, in the MISFET 20, the second gate electrode G2 on the upper surface of the second semiconductor substrate 11b is electrically connected to the gate terminal electrode 73G, which is formed on the base plate 70, by a metal wire 75c. Similarly, in the MISFET 20, the second drain electrode D2 on the upper surface of the second semiconductor substrate 11b is electrically connected to the gate terminal electrode 73G, which is formed on the base plate 70, by a metal wire 75d. In other words, in the semiconductor device of the second embodiment, the second gate electrode G2 and the second drain electrode D2 of the MISFET 20 are electrically connected to the same gate terminal electrode 73G. Thus, the structure in which the second gate electrode G2 and the second drain electrode D2 of the MISFET 20 are connected to each other by short-circuiting in the structure described with reference to the circuit diagram of above-described FIG. 1 is achieved. The gate terminal electrode 73G of FIG. 17 corresponds to the second drain electrode D2 of above-described FIG. 1.

In the above-described manner, the configuration of the semiconductor device composed of the junction FET 10 and the MISFET 20 illustrated in above-described FIG. 1 can be achieved by using the different chips and disposing the chips on the same base plate 70. Effects in terms of operation are the same as those of the first embodiment. More specifically, a higher threshold voltage and suppression of the gate current can be achieved.

Furthermore, in the semiconductor device of the second embodiment, the structure of the semiconductor device and the manufacturing steps of the elements can be simplified by forming the junction FET 10 and the MISFET 20 as different chips.

Meanwhile, from the viewpoint of reducing the possibility of false turn-on by shortening the wiring length and reducing the wiring inductance, the structure in which the junction FET 10 and the MISFET 20 are formed on the same substrate like the first embodiment is more preferable.

Figure 18:
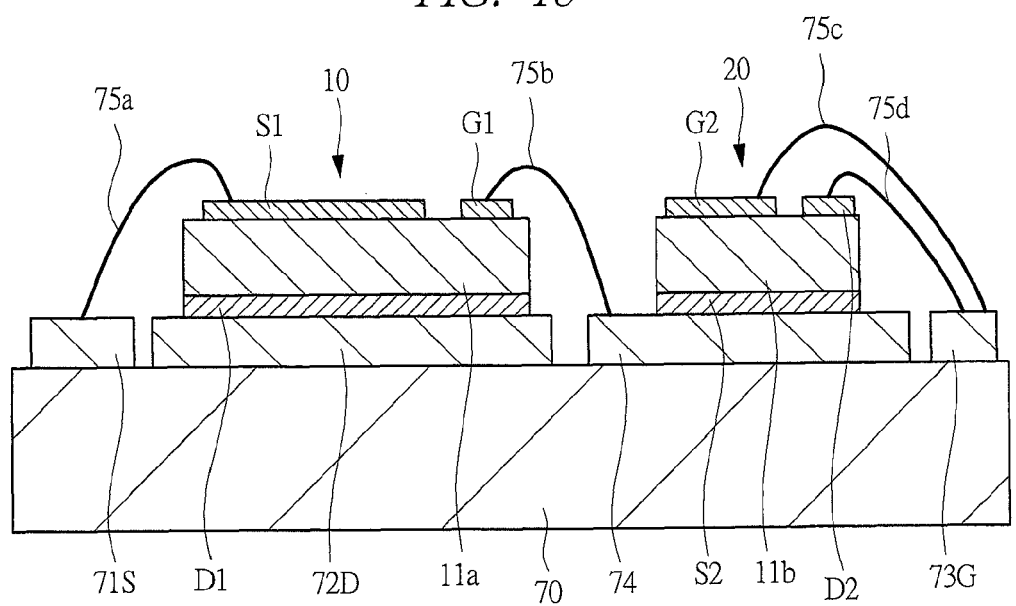
FIG. 18 is a cross-sectional view of main parts of another semiconductor device which is the second embodiment of the present invention.

Another wiring method of the semiconductor device of the second embodiment as described above will be described. As illustrated in FIG. 18, the junction FET 10 and the MISFET 20 are composed of different semiconductor substrates (chips), and these are mounted on the same base plate 70 by solder-bonding and sealed in the same package. This point is the same as the semiconductor device described with reference to FIG. 17 described above. The wiring structures here are also the same as the wiring structures described with reference to above-described FIG. 17 except for the points described below.

In the MISFET 20 formed in the second semiconductor substrate 11b the second source electrode S2 on the upper surface may be covered with an insulating film, and a pad part to which a metal wire or the like can be connected does not exist. Even in this case, since the p-type well layer 21 and the second n-type source layer 25 are short-circuited in the MISFET 20 (see above-described FIG. 5 as an example), the soldering/connecting method of the junction FET 10 and the MISFET 20 may be the same as that of above-described FIG. 17. When the metal wire 75b directly connecting the first gate electrode G1and the second source electrode S2 is removed from the circuit configuration of FIG. 17, the circuit configuration of FIG. 18 can be achieved.

Even when the above-described structure is used, the configuration of the semiconductor device composed of the junction FET 10 and the MISFET 20 illustrated in above-described FIG. 1 can be achieved by using the different chips and disposing the chips on the same base plate 70. This point is the same as the structure described with reference to above-described FIG. 17, and the same effects can be obtained. More specifically, the structure and the manufacturing method can be simplified. Moreover, the effects in terms of operation are the same as those of the first embodiment. More specifically, a higher threshold voltage and suppression of the gate current can be achieved.

Figure 19:
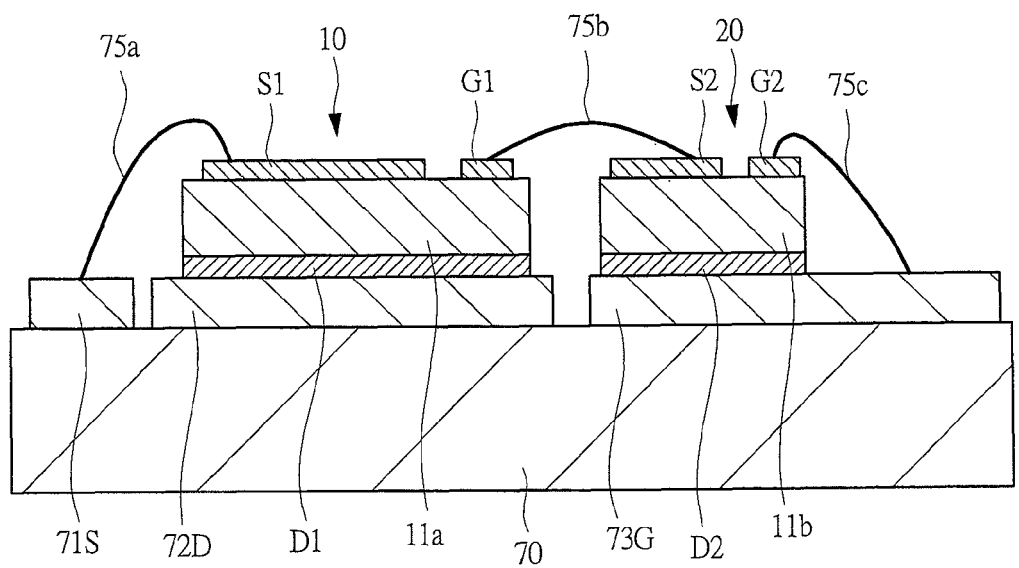
FIG. 19 is a cross-sectional view of main parts of still another semiconductor device which is the second embodiment of the present invention.

Furthermore, another wiring method will be described. As illustrated in FIG. 19, the junction FET 10 and the MISFET 20 are composed of different semiconductor substrates (chips), and the substrates are mounted on the same base plate 70 by solder-bonding and sealed in the same package. This point is the same as the semiconductor device described with reference to FIG. 17 described above. The wiring structure here is also the same as the wiring structure described with reference to above-described FIG. 17 except for the points described below.

In the MISFET 20 formed in the second semiconductor substrate 11b the second drain electrode D2 may be disposed on the lower surface of the second semiconductor substrate 11b. Note that, the second source electrode S2 and the second gate electrode G2 are formed on the upper surface of the second semiconductor substrate 11b. When the second drain electrode D2 is disposed on the lower surface of the second semiconductor substrate 11b in this manner, the intermediate terminal electrode 74 used in above-described FIG. 17 and FIG. 18 is unnecessary.

The first gate electrode G1 disposed on the upper surface of the first semiconductor substrate 11a in the junction FET 10 is electrically connected to the second source electrode S2, which is disposed on the upper surface of the second semiconductor substrate 11b in the MISFET 20, by the metal wire 75b. As a result, the structure in which the first gate electrode G1 of the junction FET 10 and the second source electrode S2 of the MISFET 20 are connected to each other by short-circuiting in the structure described by the circuit diagram of above-described FIG. 1 is achieved.

In addition, in the MISFET 20, the second drain electrode D2 on the lower surface of the second semiconductor substrate 11b is electrically connected to the gate terminal electrode 73G, which is on the base plate 70, by solder-bonding. Further, in the MISFET 20, the second gate electrode G2 on the upper surface of the second semiconductor substrate 11b is electrically connected to the gate terminal electrode 73G, which is formed on the base plate 70, by the metal wire 75c. In other words, in the semiconductor device of the second embodiment, the second gate electrode G2 and the second drain electrode D2 of the MISFET 20 are electrically connected to the same gate terminal electrode 73G. As a result, the structure in which the second gate electrode G2 and the second drain electrode D2 of the MISFET 20 are connected to each other by short-circuiting in the structure described by the circuit diagram of above-described FIG. 1 is achieved. The gate terminal electrode 73G in FIG. 19 corresponds to the second drain electrode D2 of above-described FIG. 1.

Even when the above-described structure is used, the configuration of the semiconductor device composed of the junction FET 10 and the MISFET 20 illustrated in above-described FIG. 1 can be achieved by using the different chips and disposing them on the same base plate 70. This point is the same as the structure described with reference to FIG. 17 above-described, and the same effects can be obtained. More specifically, the structure and the manufacturing method can be simplified. Moreover, the effects in terms of operation are the same as those of the first embodiment. More specifically, a higher threshold voltage and suppression of the gate current can be achieved.

(Third Embodiment)

Figure 20:
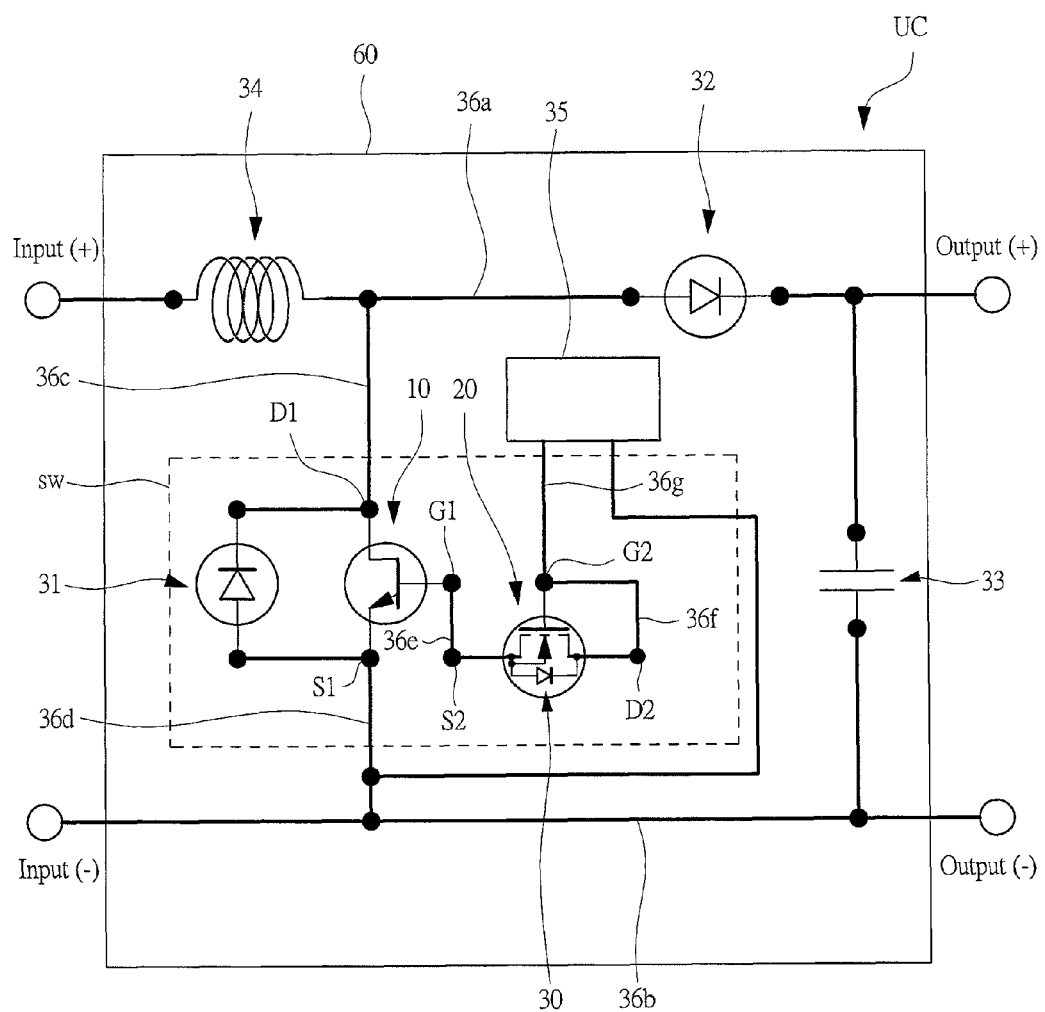
FIG. 20 is a circuit diagram of a semiconductor device which is a third embodiment of the present invention.

In a third embodiment, a semiconductor device in which semiconductor elements composed of the junction FET 10 and the MISFET 20 described in the first embodiment are used will be described. A circuit diagram of the semiconductor device of the third embodiment is shown in FIG. 20. The semiconductor device of the third embodiment has the junction FET 10 and the MISFET 20, which are composed of two independent individual semiconductor elements, as components thereof. In other words, the junction FET 10 and the MISFET 20 are composed of mutually-different packages. Terminals of the semiconductor elements such as the junction FET 10 and the MISFET 20 are disposed on the same circuit board (or printed circuit board) 60 and connected by wiring on the circuit board 60 so as to form the device.

FIG. 20 illustrates a boost chopper UC for a power factor improvement circuit (PFC). The boost chopper UC has the following components. Two diodes 31 and 32 are disposed on the circuit board 60. SiC Schottky diodes are used as the diodes 31 and 32 to reduce loss and enhance conversion efficiency. In addition, a capacitor 33 and an inductor 34 are disposed on the circuit board 60. A switching element sw is added to the elements of the diodes 31 and 32, the capacitor 33, and the inductor 34 so as to constitute the boost chopper UC. In addition, the circuit has a gate drive circuit 35 which controls the switching element sw. In the boost chopper UC which the semiconductor device of the third embodiment has, the junction FET 10 is used as the switching element sw. In FIG. 20, the region surrounded by a broken line is the region which functions as the switching element sw. The switching element sw has the junction FET 10 as a main transistor and has the MISFET 20 as a transistor for control. The method of wiring and connecting the elements on the circuit board 60 will be described below in detail.

Main wiring 36a on a high-voltage side extended from an input terminal (+) to an output terminal (+) via the inductor 34 and the diode 32 and main wiring 36b on a low-voltage side extended from an input terminal (−) to an output terminal (−) are disposed on the circuit board 60.

The first drain electrode D1 of the junction FET 10 is connected to the main wiring 36a on the high-voltage side by wiring 36c on the circuit board 60. Also, the first source electrode S1 of the junction FET 10 is connected to the main wiring 36b on the low-voltage side by wiring 36d on the circuit board 60.

The first gate electrode G1 of the junction FET 10 is connected to the second source electrode S2 of the MISFET 20 by wiring 36e on the circuit board 60. Thus, the structure in which the first gate electrode G1 of the junction FET 10 and the second source electrode S2 of the MISFET 20 are connected to each other by short-circuiting is formed. The second drain electrode D2 of the MISFET 20 is connected to the second gate electrode G2 by wiring 36f on the circuit board 60. Thus, the structure in which the second drain electrode D2 and the second gate electrode G2 of the MISFET 20 are connected to each other by short-circuiting is formed. Note that the diode 30 is built in so as to be connected in parallel to the MISFET 20.

The second gate electrode G2 of the MISFET 20 (same potential as the second drain electrode D2) is connected to the gate drive circuit 35 by wiring 36g on the circuit board 60.

When the wiring and connecting method as described above is employed, the switching element sw applied to the boost chopper UC of the third embodiment can be caused to have the configuration as described with reference to FIG. 1 described in the first embodiment. More specifically, the semiconductor device of the third embodiment has the switching element sw composed of the junction FET 10 serving as the main transistor and the MISFET 20 serving as the transistor for control. Therefore, also in such a switching element sw, the effects in terms of operation that a higher threshold voltage and suppression of the gate current can be achieved are brought about as well as those of the first embodiment. In the boost chopper UC of the third embodiment, an excessive gate current can be suppressed even when the output voltage of the gate drive circuit 35 upon switch-on is set to 10 V in order to increase the switching speed of the junction FET 10 and reduce switching loss. As a result, load on the gate drive circuit 35 is reduced, and the gate drive circuit 35 can be downsized. As a result, the characteristics of the semiconductor device having the junction FET can be further improved.

In the semiconductor device of the third embodiment, the junction FET 10 and the MISFET 20, which are independent as different packages, are used and connected on the circuit board 60, thereby achieving the configuration as illustrated in the circuit diagram of above-described FIG. 1. As a result, the structure of the semiconductor device and the manufacturing steps of the elements can be more simplified.

Meanwhile, from the viewpoint of reducing the possibility of false turn-on by shortening the wiring length and reducing the wiring inductance, the structure in which the junction FET 10 and the MISFET 20 are formed on the same substrate like the first embodiment or the structure in which they are disposed in the same package like the second embodiment is more preferable.

(Fourth Embodiment)

Figure 21:
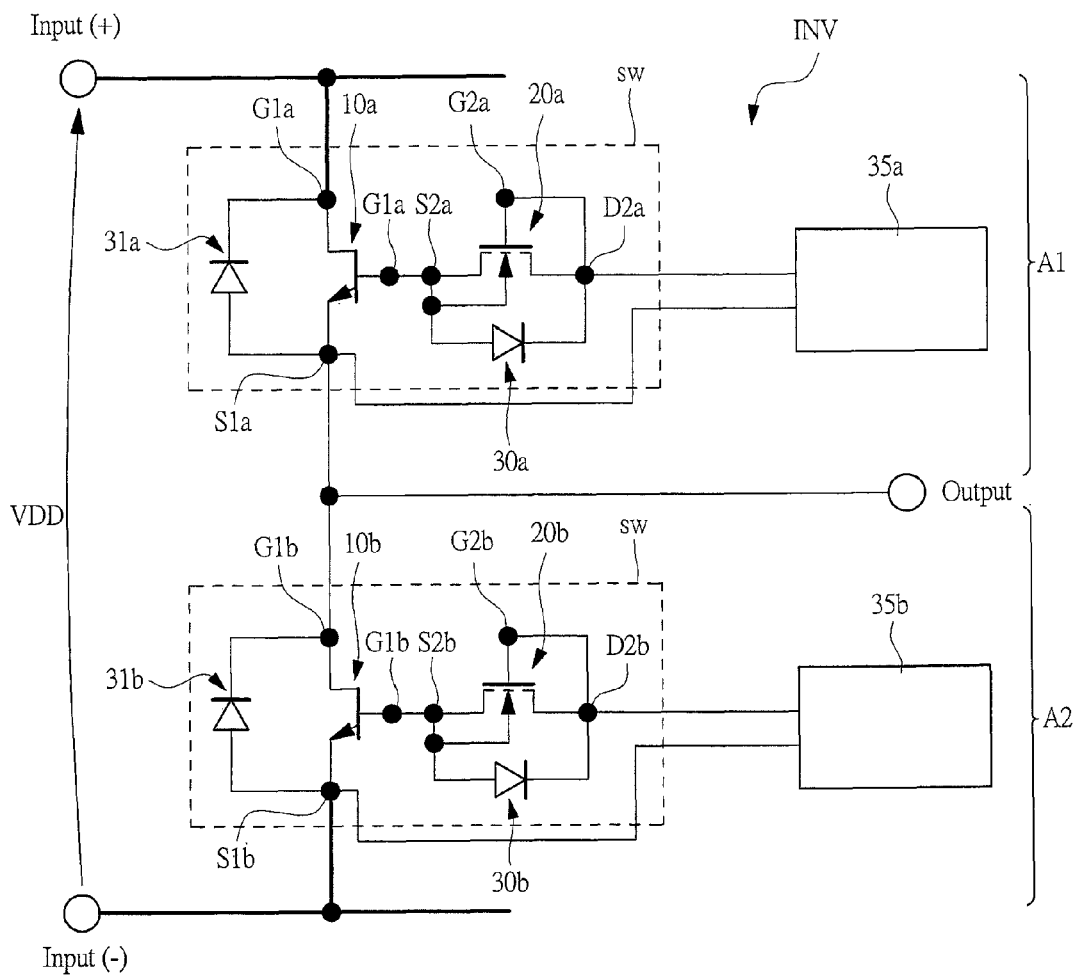
FIG. 21 is a circuit diagram of a semiconductor device which is a fourth embodiment of the present invention.

In a fourth embodiment, another semiconductor device which is effective when semiconductor elements composed of the junction FET 10 and the MISFET 20 described in the first embodiment are used will be described. A circuit diagram of the semiconductor device of the fourth embodiment is illustrated in FIG. 21. FIG. 21 illustrates a circuit diagram illustrating a single-phase inverter (or one phase of a three-phase inverter). Hereinafter, the inverter will be simply referred to as "inverter INV".

The elements constituting the inverter INV which the semiconductor device of the fourth embodiment has will be described in detail. In the inverter INV, the part between an input (+) and an output is referred to as an upper arm A1, and the part between an input (−) and the output is referred to as a lower arm A2. In the fourth embodiment, the potential difference VDD between the upper arm A1 and the lower arm A2 (voltage between the input (+) and the input (−)) is 300 V.

The arms A1 and A2 are respectively provided with the switching elements sw having below configurations. In FIG. 21, the regions surrounded by broken lines are the parts constituting the switching elements sw of the fourth embodiment. The switching elements sw have first and second junction FETs 10a and 10b as main transistors and have first and second MISFETs 20a and 20b as transistors for control. Herein, the upper arm A1 is provided with the first junction FET 10a and the first MISFET 20a, and the lower arm A2 is provided with the second junction FET 10b and the second MISFET 20b. Each of the junction FETs 10a and 10b has a breakdown voltage of 600 V, a threshold voltage of 1.2 V, and the on-voltage upon current application of 100 A is 1 V. A first fly-wheel diode (first diode) 31a is connected to the first junction FET 10a in parallel, and a second fly-wheel diode (first diode) 31b is connected to the second junction FET 10b in parallel so that the current can be flowed back upon switching off.

A first gate electrode G1a of the first junction FET 10a is connected to a second source electrode S2a of the first MISFET 20a, and a first gate electrode G1b of the second junction FET 10b is connected to a second source electrode S2b of the second MISFET 20b. A second gate electrode G2a and a second drain electrode D2a of the first MISFET 20a are connected to each other by short-circuiting, and a second gate electrode G2b and a second drain electrode D2b of the second MISFET 20b are connected to each other by short-circuiting. The second gate electrodes G2a and G2b (correspond to the second drain electrodes D2a and D2b) of the junction FETs 10a and 10b are connected to a first gate drive circuit 35a and the second gate drive circuit 35b, respectively.

In this manner, the switching elements sw constituting the arms A1 and A2 have the structure described with reference to FIG. 1 in the first embodiment described above.

In the inverter INV, the first junction FET 10a and the second junction FET 10b serving as the switching elements sw of the upper arm A1 and the lower arm A2 are controlled so that the FETs are not turned on at the same time in order to prevent short-circuiting between the input (+) and the input (−). More specifically, when the voltage which turns on the first junction FET 10a is outputted from the first gate drive circuit 35a of the upper arm A1, the voltage which turns off the second junction FET 10b has to be outputted from the second gate drive circuit 35b of the lower arm A2, and vice versa.

An example of the above switching operation in which the second junction FET 10b of the lower arm A2 is turned on from the state in which both of the junction FETs 10a and 10b of the upper and lower arms A1 and A2 are off will be described. When the two junction FETs 10a and 10b are off, in an equilibrium state, the potential difference VDD (300 V) inputted to the entirety is equally shared by the junction FETs 10a and 10b of the upper and lower arms A1 and A2. In other words, the potential of the first source electrode S1a of the junction FET 10a of the upper arm A1 is equal to half (150 V) of the potential difference VDD input to the entirety. At this point, the first junction FET 10a is in the off-state; therefore, the output voltage from the first gate drive circuit 35a is the same as the potential of the first source electrode S1a. In other words, the potential of the second drain electrode D2a viewed from the first source electrode S1a is 0 V.

In this state, the second junction FET 10b of the lower arm A2 is turned on. The on-voltage is sufficiently smaller than half (150 V) of the potential difference VDD inputted to the entirety; therefore, a voltage change of the first source electrode S1a of the upper arm A1 is substantially half of the potential difference VDD inputted to the entirety. Herein, capacitance components are present between the gate and the drain and between the gate and the source of the first junction FET 10a. Therefore, when the first junction FET 10a is directly connected to the first gate drive circuit 35a, due to the voltage change of the first source electrode S1a, charge/discharge of the capacitance components are caused to occur, and, as a result, the potential of the first gate electrode G1a is increased. When input capacitance of the first junction FET 10a according to the capacitance components is Ciss, a reverse transfer capacitance is Crss, and the potential difference inputted to the entirety is VDD, the amount of the above-described increase in the potential is Crss/(Ciss+Crss)×VDD/2. When the first junction FET 10a is directly driven, an increase in the potential of the first gate electrode G1a is 1.6 V, resulting in arm short-circuiting in which the upper and lower two first and second junction FETs 10a and 10b are turned on at the same time due to the voltage exceeding the threshold voltage.

Regarding this point, the semiconductor device of the fourth embodiment has the configuration in which the first gate electrode G1a of the first junction FET 10a is connected to the first gate drive circuit 35a through the first MISFET 20a having the second drain electrode D2a and the second gate electrode G2a connected by short-circuiting. As a result, the potential increase of the first gate electrode G1a is also distributed to the first MISFET 20a, and the malfunction which is caused when the voltage exceeds the threshold voltage like the above-described case can be suppressed. As a result, the characteristics of the semiconductor device having the junction FET can be more improved.

In the foregoing, the invention made by the inventor of the present invention has been concretely described based on the embodiments. However, it is needless to say that the present invention is not limited to the foregoing embodiments and various modifications and alterations can be made within the scope of the present invention.

The present invention is applicable to a semiconductor device having a junction FET as a switching element.

What is claimed is:

1. A semiconductor device comprising a junction FET as a main transistor and a MISFET as a transistor for control, wherein
    the junction FET has a first gate electrode, a first source electrode, and a first drain electrode,
    the MISFET has a second gate electrode, a second source electrode, and a second drain electrode,
    the MISFET is an n-channel type MISFET and has electric characteristics of an enhancement mode MISFET,
    the second gate electrode and the second drain electrode of the MISFET are connected to each other by short-circuiting, and
    the first gate electrode of the junction FET and the second source electrode of the MISFET are connected to each other by short-circuiting.

2. The semiconductor device according to claim 1, wherein the junction FET and the MISFET are disposed on a same semiconductor substrate,
    on the semiconductor substrate, the junction FET has:
        (a1) an n-type drift layer;
        (a2) a first n-type source layer formed in the n-type drift layer; and
        (a3) a p-type gate layer formed in the n-type drift layer and electrically connected to the first n-type source layer,
    on the semiconductor substrate, the MISFET has:
        (b1) a p-type well layer formed in the n-type drift layer;
        (b2) a gate electrode formed on the p-type well layer interposing a gate insulating film; and
        (b3) a second n-type source layer and a second n-type drain layer formed in the p-type well layer at side lower portions of the gate electrode,
    the p-type gate layer and the second n-type source layer are formed to have a junction part,
    the p-type gate layer and the p-type well layer are formed to have a junction part,
    the first source electrode is formed to be electrically connected to the first n-type source layer,
    the first drain electrode is formed to be electrically connected to the semiconductor substrate,
    the first gate electrode and the second source electrode are formed to be mutually integrated and be electrically connected to the p-type gate layer and the second n-type source layer, and
    the second gate electrode and the second drain electrode are formed to be mutually integrated and be electrically connected to the gate electrode and the second n-type drain layer.

3. The semiconductor device according to claim 2, wherein the semiconductor substrate is a semiconductor material mainly composed of SiC.

4. The semiconductor device according to claim 1, wherein
the junction FET is disposed on a first semiconductor substrate;
the MISFET is disposed on a second semiconductor substrate; and
the first semiconductor substrate and the second semiconductor substrate are sealed in a same package.

5. The semiconductor device according to claim 4, wherein,
on the first semiconductor substrate, the junction FET has:
(a1) an n-type drift layer;
(a2) a first n-type source layer formed in the n-type drift layer; and
(a3) a p-type gate layer formed in the n-type drift layer and electrically connected to the first n-type source layer; and,
on the second semiconductor substrate, the MISFET has:
(b1) a p-type well layer;
(b2) a gate electrode formed on the p-type well layer interposing a gate insulating film; and
(b3) a second n-type source layer and a second n-type drain layer formed in the p-type well layer at side lower portions of the gate electrode.

6. The semiconductor device according to claim 5, wherein the first semiconductor substrate is formed of a semiconductor material mainly composed of SiC.

7. The semiconductor device according to claim 6, wherein
the first semiconductor substrate and the second semiconductor substrate are disposed on a same base plate,
a source terminal electrode, a drain terminal electrode, and a gate terminal electrode capable of being electrically connected to outside of the package are disposed on the base plate,
an intermediate terminal electrode is disposed on the base plate,
the first source electrode is formed on an upper surface of the first semiconductor substrate to be electrically connected to the first n-type source layer,
the first gate electrode is formed on the upper surface of the first semiconductor substrate to be electrically connected to the p-type gate layer,
the first drain electrode is formed on a lower surface of the first semiconductor substrate to be electrically connected to the first semiconductor substrate,
the second source electrode is formed at two locations, that is, on an upper surface and a lower surface of the second semiconductor substrate to be electrically connected to the second n-type source layer,
the second gate electrode is formed on the upper surface of the second semiconductor substrate to be electrically connected to the gate electrode,
the second drain electrode is formed on the upper surface of the second semiconductor substrate to be electrically connected to the second n-type drain layer,
the first drain electrode on the lower surface of the first semiconductor substrate and the drain terminal electrode are electrically bonded with each other by soldering,
the second source electrode on the lower surface of the second semiconductor substrate and the intermediate terminal electrode are electrically bonded with each other by the soldering,
the first source electrode and the source terminal electrode are electrically connected to each other by a metal wire,
the first gate electrode is electrically connected to the second source electrode and the intermediate terminal electrode by the metal wire, and
the second gate electrode and the second drain electrode are electrically connected to the gate terminal electrode by the metal wire.

8. The semiconductor device according to claim 6, wherein
the first semiconductor substrate and the second semiconductor substrate are disposed on a same base plate,
a source terminal electrode, a drain terminal electrode, and a gate terminal electrode capable of being electrically connected to outside of the package are disposed on the base plate,
an intermediate terminal electrode is disposed on the base plate,
the first source electrode is formed on an upper surface of the first semiconductor substrate to be electrically connected to the first n-type source layer,
the first gate electrode is formed on the upper surface of the first semiconductor substrate to be electrically connected to the p-type gate layer,
the first drain electrode is formed on a lower surface of the first semiconductor substrate to be electrically connected to the first semiconductor substrate,
the second source electrode is formed on a lower surface of the second semiconductor substrate to be electrically connected to the second n-type source layer,
the second gate electrode is formed on the upper surface of the second semiconductor substrate to be electrically connected to the gate electrode,
the second drain electrode is formed on the upper surface of the second semiconductor substrate to be electrically connected to the second n-type drain layer,
the first drain electrode on the lower surface of the first semiconductor substrate and the drain terminal electrode are electrically bonded with each other by soldering,
the second source electrode on the lower surface of the second semiconductor substrate and the intermediate terminal electrode are electrically bonded with each other by the soldering,
the first source electrode and the source terminal electrode are electrically connected to each other by a metal wire,
the first gate electrode and the intermediate terminal electrode are electrically connected by the metal wire, and
the second gate electrode and the second drain electrode are electrically connected to the gate terminal electrode by the metal wire.

9. The semiconductor device according to claim 6, wherein
the first semiconductor substrate and the second semiconductor substrate are disposed on a same base plate,
a source terminal electrode, a drain terminal electrode, and a gate terminal electrode capable of being electrically connected to outside of the package are disposed on the base plate,
the first source electrode is formed on an upper surface of the first semiconductor substrate to be electrically connected to the first n-type source layer,
the first gate electrode is formed on the upper surface of the first semiconductor substrate to be electrically connected to the p-type gate layer,
the first drain electrode is formed on a lower surface of the first semiconductor substrate to be electrically connected to the first semiconductor substrate,
the second source electrode is formed on an upper surface of the second semiconductor substrate to be electrically connected to the second n-type source layer,
the second gate electrode is formed on the upper surface of the second semiconductor substrate to be electrically connected to the gate electrode, the second drain electrode is formed on the lower surface of the second semiconductor substrate to be electrically connected to the second n-type drain layer, the first drain electrode on the lower surface of the first semiconductor substrate and the drain terminal electrode are electrically bonded with each other by soldering, the second drain electrode on the lower surface of the second semiconductor substrate and the gate terminal electrode are electrically bonded with each other by the soldering, the first source electrode and the source terminal electrode are electrically connected to each other by a metal wire, the first gate electrode and the second source electrode are electrically connected by the metal wire, and the second gate electrode and the gate terminal electrode are electrically connected by the metal wire.

10. The semiconductor device according to claim 1, wherein the junction FET and the MISFET are composed of mutually different packages and are disposed on a same printed circuit board.

11. A semiconductor device comprising a boost chopper, wherein the boost chopper has a switching element, the switching element is composed of a junction FET serving as a main transistor and a MISFET serving as a transistor for control, the junction FET has a first gate electrode, a first source electrode, and a first drain electrode, the MISFET has a second gate electrode, a second source electrode, and a second drain electrode, the MISFET is an n-channel type MISFET and has electric characteristics of an enhancement mode MISFET, the second gate electrode and the second drain electrode of the MISFET are connected to each other by short-circuiting, and the first gate electrode of the junction FET and the second source electrode of the MISFET are connected to each other by short-circuiting.

12. A semiconductor device comprising an inverter, wherein the inverter has a plurality of switching elements, each of the switching elements are composed of a junction FET serving as a main transistor and a MISFET serving as a transistor for control, the junction FET has a first gate electrode, a first source electrode, and a first drain electrode, the MISFET has a second gate electrode, a second source electrode, and a second drain electrode, the MISFET is an n-channel type MISFET and has electric characteristics of an enhancement mode MISFET, the second gate electrode and the second drain electrode of the MISFET are connected to each other by short-circuiting, and the first gate electrode of the junction FET and the second source electrode of the MISFET are connected to each other by short-circuiting.

13. The semiconductor device according to claim 12, wherein the plurality of switching elements further has a first diode, and the first diode is connected to the junction FET in parallel.

* * * * *